US012787813B2

(12) United States Patent
Lam et al.

(10) Patent No.: US 12,787,813 B2
(45) Date of Patent: Nov. 3, 2026

(54) BACK SIDE POWER DELIVERY FOR WAFER-SCALE INTEGRATION WITH AN ISOMETRIC GRID COMPRESSION PLATE

(71) Applicant: Volantis Semiconductor, Inc., Portland, OR (US)

(72) Inventors: Kevin Nan Lam, Pleasanton, CA (US); Tapabrata Ghosh, San Francisco, CA (US)

(73) Assignee: Volantis Semiconductor, Inc., Portland, OR (US)

( * ) Notice: Subject to any disclaimer, the term of this patent is extended or adjusted under 35 U.S.C. 154(b) by 68 days.

(21) Appl. No.: 19/056,456

(22) Filed: Feb. 18, 2025

(65) Prior Publication Data

US 2026/0123468 A1 Apr. 30, 2026

Related U.S. Application Data

(63) Continuation-in-part of application No. 19/023,647, filed on Jan. 16, 2025, which is a continuation-in-part of application No. 18/978,188, filed on Dec. 12, 2024, which is a continuation-in-part of application No. 18/958,107, filed on Nov. 25, 2024, which is a continuation-in-part of application No. 18/940,944, filed on Nov. 8, 2024.

(Continued)

(51) Int. Cl.

| | |
|---|---|
| ***H10W 20/00*** | (2026.01) |
| ***H10W 70/05*** | (2026.01) |
| ***H10W 70/60*** | (2026.01) |
| ***H10W 90/00*** | (2026.01) |
| *H10W 40/10* | (2026.01) |

(52) U.S. Cl.

CPC .......... *H10W 70/611* (2026.01); *H10W 70/05* (2026.01); *H10W 90/00* (2026.01); *H10W 90/401* (2026.01); *H10W 40/10* (2026.01)

(58) Field of Classification Search

CPC ... H10W 20/00; H10W 20/01; H10W 20/021; H10W 20/023; H10W 70/611; H10W 70/614; H10W 90/00; H05K 1/181

USPC ................. 257/678, 691, 731, 784, E23.001

See application file for complete search history.

(56) References Cited

U.S. PATENT DOCUMENTS

| | | | |
|---|---|---|---|
| 9,886,193 | B2 | 2/2018 | Berger et al. |
| 10,332,931 | B2 | 6/2019 | Cassidy et al. |

(Continued)

*Primary Examiner* — Hai L Nguyen

(74) *Attorney, Agent, or Firm* — Adams Intellex, PLC

(57) ABSTRACT

Disclosed techniques enable back side power delivery for wafer-scale integration with an isometric grid compression plate. A wafer-scale integration interposer (WSII) is accessed. A front side of the WSII is bonded to functional chips. The WSII includes through-silicon vias (TSVs). Modular power substrates (MPSs) are attached to a back side of the WSII, based on conductive connecting materials. The attaching includes compressing, by an isometric grid array (IGA), each conductive connecting material. The attaching couples each MPS to one or more functional chips. The MPSs are mechanically connected to a unified control board (UCB) based on a plurality of high power sockets. The UCB includes a plurality of DC-to-DC power converters. DC power is sent, by the UCB, to the plurality of functional chips. The sending is based on the plurality of DC-to-DC power converters, the plurality of MPSs, and the plurality of TSVs.

27 Claims, 16 Drawing Sheets

Related U.S. Application Data

(60) Provisional application No. 63/750,822, filed on Jan. 29, 2025, provisional application No. 63/750,817, filed on Jan. 29, 2025, provisional application No. 63/720,216, filed on Nov. 14, 2024, provisional application No. 63/714,353, filed on Oct. 31, 2024.

(56) References Cited

U.S. PATENT DOCUMENTS

| | | | | |
|---|---|---|---|---|
| 10,613,754 | B2 | 4/2020 | Berger et al. | |
| 11,328,208 | B2 | 5/2022 | Lie et al. | |
| 12,519,073 | B2 * | 1/2026 | Eid | H10W 70/09 |
| 12,622,265 | B2 * | 5/2026 | Chang | H10P 72/74 |
| 2020/0258838 | A1 | 8/2020 | Ghosh | |

* cited by examiner

BACK SIDE POWER DELIVERY FOR WAFER-SCALE INTEGRATION WITH AN ISOMETRIC GRID COMPRESSION PLATE

RELATED APPLICATIONS

This application claims the benefit of U.S. provisional patent applications "Chiplet-Based Optical Wafer-Scale Network Switch" Ser. No. 63/750,817, filed Jan. 29, 2025, and "Wafer-Scale Integration Power Delivery With An Isotropic Conductive Adhesive" Ser. No. 63/750,822, filed Jan. 29, 2025.

This application is also a continuation-in-part of U.S. patent application "Back Side Power Delivery For Wafer-Scale Integration Sith Solderless Modular Power Substrates" Ser. No. 19/023,647, filed Jan. 16, 2025, which claims the benefit of U.S. provisional patent applications "Cooling for Wafer-Scale Integration With Back Side Power Coupling" Ser. No. 63/714,353, filed Oct. 31, 2024, and "Back Side Wafer-Scale Power Delivery With An Anisotropic Film" Ser. No. 63/720,216, filed Nov. 14, 2024.

The U.S. patent application "Back Side Power Delivery For Wafer-Scale Integration Sith Solderless Modular Power Substrates" Ser. No. 19/023,647, filed Jan. 16, 2025 is also a continuation-in-part of U.S. patent application "Wafer-Scale Integration With A Stiffening Isometric Grid Array" Ser. No. 18/978,188, filed Dec. 12, 2024, which claims the benefit of U.S. provisional patent applications "Cooling for Wafer-Scale Integration With Back Side Power Coupling" Ser. No. 63/714,353, filed Oct. 31, 2024, and "Back Side Wafer-Scale Power Delivery With An Anisotropic Film" Ser. No. 63/720,216, filed Nov. 14, 2024.

The U.S. patent application "Wafer-Scale Integration With A Stiffening Isometric Grid Array" Ser. No. 18/978,188, filed Dec. 12, 2024 is also a continuation-in-part of U.S. patent application "Cold Plate Cooling For Wafer-Scale Integration With Back Side Modular Power Delivery" Ser. No. 18/958,107, filed Nov. 25, 2024, which claims the benefit of U.S. provisional patent applications "Cooling for Wafer-Scale Integration With Back Side Power Coupling" Ser. No. 63/714,353, filed Oct. 31, 2024, and "Back Side Wafer-Scale Power Delivery With An Anisotropic Film" Ser. No. 63/720,216, filed Nov. 14, 2024.

The U.S. patent application "Cold Plate Cooling For Wafer-Scale Integration With Back Side Modular Power Delivery" Ser. No. 18/958,107, filed Nov. 25, 2024, is also a continuation-in-part of U.S. patent application "Back Side Wafer-Scale Integration With Modular Power Delivery" Ser. No. 18/940,944, filed Nov. 8, 2024, which claims the benefit of U.S. provisional patent application "Cooling for Wafer-Scale Integration With Back Side Power Coupling" Ser. No. 63/714,353, filed Oct. 31, 2024.

Each of the foregoing applications is hereby incorporated by reference in its entirety.

FIELD OF ART

This application relates generally to power delivery and more particularly to back side power delivery for wafer-scale integration with an isotropic grid compression plate.

BACKGROUND

Modern electronic systems range in size and complexity from massive AI data centers to body-worn devices, such as smartwatches. While the amount of power required by these vastly different systems ranges over many orders of magnitude, the fact remains that the power delivered to the systems must be stable and reliable. The move away from fossil fuel based energy sources by many municipalities, states, regions, and countries has heightened the demand for electricity of higher power systems. Some of these transitions are encouraged by the use of discounts, rebates, and other incentives, while other transitions are mandated. For example, some municipalities and states are forcing the move from fossil fuel based domestic heating systems and cooking devices to electrical ones. These mandates, and the resulting increases in demand for electrical power, are putting massive demands on electrical distribution or "grid" infrastructure. While renewal, replacement, and expansion of the grid infrastructure are indicated to meet increased demand, there is substantial pushback from residents through whose towns expanded infrastructure would pass. Rural residents are rejecting high-tension lines passing through their towns to power far away cities while delivering none of the power to the impacted residents.

Battery technology has evolved to meet the increased power demands of popular personal electronic devices. The new batteries provide improved power density and faster charging times, among other benefits, compared to earlier battery types. The nickel-cadmium (NiCd) batteries of yore have given way to better technologies and chemistries such as nickel-metal hydride (NiMH) and lithium-ion (Li-ion). These latter batteries offer higher power densities per unit volume, plus longer lasting and more stable power delivery. Another new battery type includes lithium-iron-phosphate ($LiFePO_4$). This latter type offers increased power output, faster charging, and lower weight compared to other cells.

The increased demand for power plants presents a wide range of opportunities and challenges. Some countries are pushing to replace their power plants that burn fossil fuels with plants that source renewable energy. These latter sources include solar, wind, and geothermal sources, among others. However, solar and wind sources are not consistently available, so energy storage and supplemental energy sources are used to enable consistent power delivery. Other countries are reinvesting in nuclear sources by modernizing decades old plants or even building new ones. Still other countries insist on building power plants that burn fossil fuels despite documented hazards that result from burning the fuels. Whatever the approach, new designs are needed to meet the increasing demand for energy.

SUMMARY

Computer users routinely demand faster computers and better applications. Further, the users demand device features that improve the usability of the devices. These device features now typically include biometric access, improved resolution cameras and three-dimensional audio. These user requirements span the wide range of computing devices. Whether the computers are vast server farms or handheld devices such as smartphones, users always desire systems and devices that are faster and more capable than the systems and devices currently in use. As a result, circuit designers continue to design and to fabricate improved integrated circuits that present ever-increasing processing performance, expanded data processing options, and "product differentiating" features. The differentiating features now typically include larger or folding touchscreens, higher resolution cameras with multiple lenses, spatial audio that simulates different listening environments, biometric sensing for facial and fingerprint recognition, and "cute" applications from games to personal emoji generation, among many other enhancements. However, increasing chip processing speeds and other capabilities such as AI processing force the addition of complex and usually large circuitry to the chips. To add new circuitry to the chips, designers employ two main design philosophies: increase the physical dimensions of the chip by making it larger or increase circuit density by reducing feature sizes. These techniques have so far been successful in meeting the never-ending customer demands for increased performance. As a result, microprocessors, graphics processors, machine learning accelerators, systems-on-chips (SoCs), and so on currently boast transistor counts into the tens of billions. Concomitant with increasing performance, the architectural improvements and added devices increase the power density of the chips, resulting in prodigious heat generation.

To further address the never ending drive for performance, some engineers have turned to wafer-scale integration. In a perfect world, the chip would be the size of an entire wafer (which can be called a monolithic wafer), and the feature sizes would include greatly reduced transistor sizes, minimum contact sizes, smaller wire widths and separation, and reductions of all other dimensions related to circuitry. In another example, the wafer can form an interposer with bonded chiplets. Regardless of methodology, to increase interconnection options, designers have considered through-silicon vias to provide direct connections between a front side of a chip (or wafer) and a back side of a chip. However, to reliably fabricate such interconnect, the wafers, for example, must be ground or polished to a thinness that supports the fabrication of the through-silicon vias. As a result, the thinned chips are prone to fracturing, not only because of the delicate nature of the materials of the wafer, but also because of the weights of the amassed elements bonded to, attached to, or otherwise connected to the wafers. Further, the coefficient of thermal expansion (CTE) can be different for various materials in a typical wafer stack-up leading to failures after power is applied and non-uniform expansion occurs between elements. Finally, various connections to the wafer must be manufactured without rupturing other existing connections (for example, an oven typically used for a reflow process can damage chip connections such as controlled collapse chip connections (C4s). Thus, proper support and stabilization of, power delivery to, connections to, and heat removal from the wafers have become paramount to prevent wafer damage or wafer failure.

Disclosed techniques enable back side power delivery for wafer-scale integration with an isometric grid compression plate. A wafer-scale integration interposer (WSII) is accessed. A front side of the WSII is bonded to functional chips. The WSII includes through-silicon vias (TSVs). Modular power substrates (MPSs) are attached to a back side of the WSII, based on conductive connecting materials. The attaching includes compressing, by an isometric grid array (IGA), each conductive connecting material. The attaching couples each MPS to one or more functional chips. The MPSs are mechanically connected to a unified control board (UCB) based on a plurality of high power sockets. The UCB includes a plurality of DC-to-DC power converters. DC power is sent, by the UCB, to the plurality of functional chips. The sending is based on the plurality of DC-to-DC power converters, the plurality of MPSs, and the plurality of TSVs.

A method for power delivery is disclosed comprising: accessing a wafer-scale integration interposer (WSII), wherein a front side of the WSII is bonded to a plurality of functional chips, wherein the WSII includes a plurality of through-silicon vias (TSVs); attaching, to a back side of the WSII, a plurality of modular power substrates (MPSs), wherein the attaching is accomplished using a plurality of conductive connecting materials, wherein the attaching includes compressing, by an isometric grid array (IGA), each conductive connecting material within the plurality of conductive connecting materials, and wherein the attaching couples each MPS within the plurality of MPSs to one or more functional chips within the plurality of functional chips; connecting mechanically the plurality of MPSs to a unified control board (UCB), wherein the connecting mechanically is based on a plurality of high power sockets, and wherein the UCB includes a plurality of DC-to-DC power converters; and sending DC power, by the UCB, to the plurality of functional chips, wherein the sending is based on the plurality of DC-to-DC power converters, the plurality of MPSs, and the plurality of TSVs.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
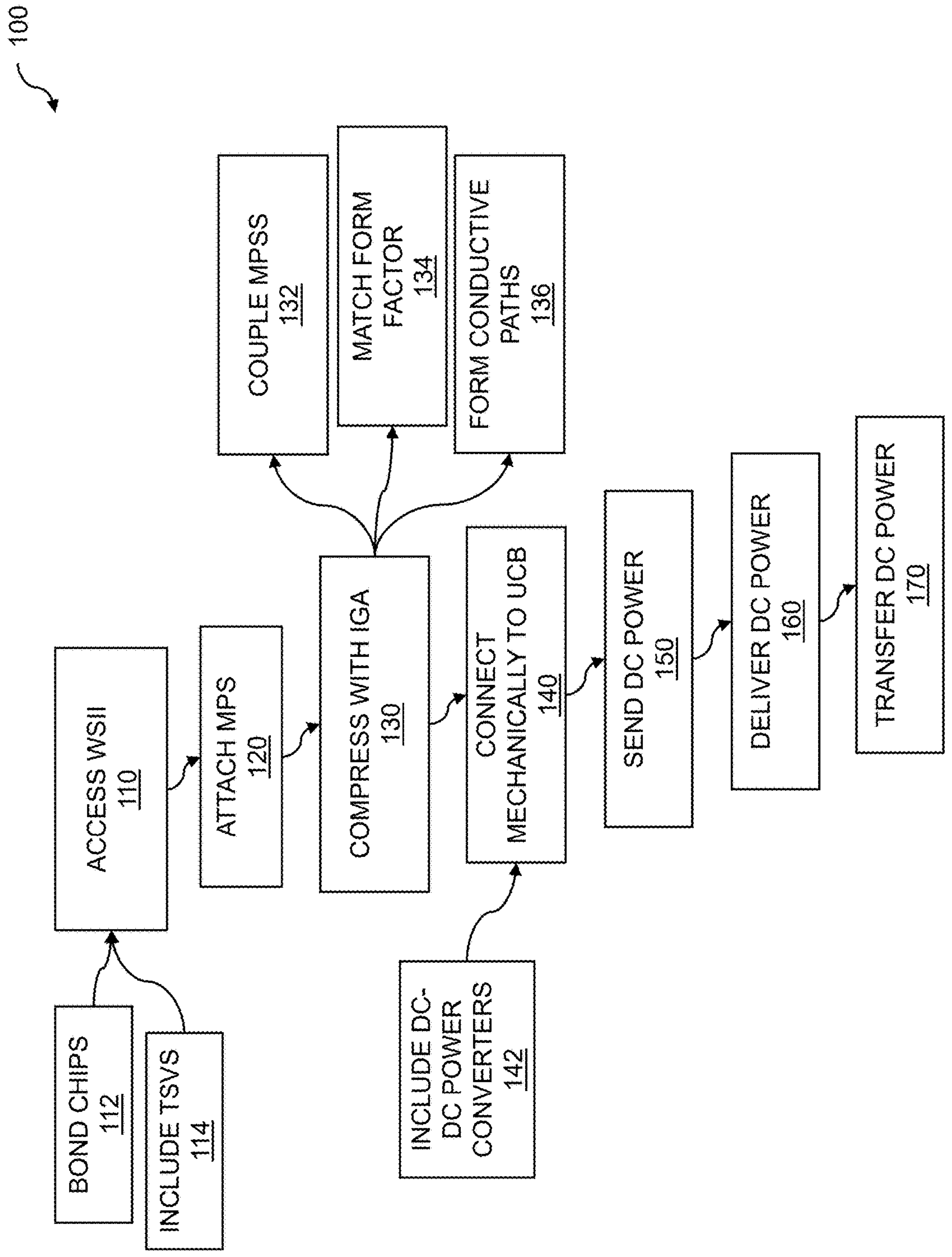
FIG. 1 is a flow diagram for back side power delivery for wafer-scale integration with solderless modular power substrates.

Techniques using back side power delivery for wafer-scale integration with an isometric grid compression plate are disclosed. Demand for significant processing performance improvements has soared, correlating with the development of new applications for processors, accelerators, and so on. This demand places immense pressure on chip designers and chip architects to develop next generation chips that can provide processing power to computers, servers, cloud servers, large language model (LLM) engines, etc. To meet these demands, vastly increased numbers of transistors have been added to a wide variety of chips such as systems-on-chip (SOCs). SOCs can include an immense range of circuitry which can include processors, memories, input/output (I/O) circuits, network switches, and other elements. These SOCs can be dimensionally large, possessing tens of billions of transistors. At the same time, the feature sizes of the transistors used for these large chips continue to shrink. In fact, according to Moore's law, the number of transistors that can fit into the same size chip should double every two years. While at some point, this doubling will likely end as the limits of lithography and physics are approached, in general, the "law" has held true for the last several decades. Keeping chip sizes roughly the same size while increasing transistor count is generally good news, but new technologies that drive smaller transistors also impose new challenges for designers. For example, as a transistor shrinks, leakage currents typically increase, driving larger power consumption for the chip. This effect, in combination with the active power required for billions of transistors, can drive extremely high-power densities for processors and other computing elements. Further, the wafers on which these large chips are fabricated are delicate. The wafers can fracture if the wafers are not properly handled and supported.

The tremendous increase of interest in and use of artificial intelligence (AI) applications, such as large neural networks, transformers, and so on, can require hundreds or even thousands of processing elements. The processing elements handle, in some cases, trillions of computations required by the AI applications. These processing elements can include processor cores, multiprocessor cores, matrix computation accelerators, SOCs, ASICs, and so on. While multiple cores such as processor cores and memory cores can be included on the same chip, many chips, and thus, many processors, are required for executing these computationally intensive applications. The processing chips can be in communication with other processing chips that are located locally and remotely. The processing chips are typically coupled via cards, data racks, and data centers. The chips, when taken together, introduce significant design challenges such as the provision of power to the chips, the cooling of all these chips, etc. For example, cooling has become a complex challenge, especially when thermal design power (TDP), a measurement of the maximum power consumed by a chip under normal operating conditions, continues to increase.

Technologies are actively being developed that improve performance of AI applications and models. One technique, wafer-scale integration, is an approach that holds great promise to address the highly demanding performance requirements, with a particular focus on the data transfer bandwidth needs of AI and other applications. Wafer-scale integration can include fabricating a monolithic wafer with any number of chips, or using a wafer as an interposer to couple many functional chips. The chips can include AI accelerators; processors and multicore processors; SOCs; application-specific integrated circuits (ASICS); memory chips such as SDRAM, DDR1, DDR2, DDR3, DDR4, DDR5 and high bandwidth memory (HBM); and so on. The functional chips can be coupled by wiring paths within the wafer interposer. The wafer interposer can be processed using a back-end-of-line (BEOL) wafer process which can include any number of metal layers. These metal layers can be used to couple any AI accelerator to any memory controller on the interposer. The wafer metal layers can provide extremely high bandwidth communication between any element included on the interposer such as memory controllers, AI processors, etc., due at least in part to short communications paths. While such technology can address the performance challenges associated with extremely compute-intensive and high bandwidth applications such as AI acceleration, challenges exist for their use in production. For example, a wafer interposer can be brittle and difficult to handle, especially with a plurality of functional chips bonded to a front side. Further, the coplanarity of the wafer interposer can vary, resulting in less-than-optimal electrical connections across the front side and back side of the wafer interposer. Grinding of the interposer, which can enable technologies such as through-silicon vias (TSVs), can thin the wafer interposer, making it still more difficult to handle without cracking. A further challenge arises in the connections between all layers of the wafer-scale integration (WSI) system. For example, chips on the top of the interposer can be mounted using flip-chip techniques via controlled collapse chip connections (C4s), microbumps, and so on to the interposer. However, for delivering power, larger DC power transformers often require soldering to the back-side of the interposer. The soldering process can include an oven which can crack or destabilize other C4s or microbumps attached to the interposer. A further complication is the difference in the thermal coefficient of expansion between a typical WSI stack-up, causing various elements to expand at different rates as temperatures rise due to operation. This can cause additional failures within a system. These issues present a substantial technical challenge for the handling, assembly, and operation of wafer interposers.

To address the significant risks while providing power to the wafer-scale integration interposer described above, back side power delivery for wafer-scale integration with an isometric grid compression plate is disclosed. A wafer-scale integration interposer (WSII) is accessed. A front side of the WSII is bonded to a plurality of functional chips. The WSII includes a plurality of through-silicon vias (TSVs). The TSVs provide connectivity between a front side of the WSII and a back side of the WSII. A plurality of modular power substrates (MPSs) is attached to a back side of the WSII. The attaching is accomplished using a plurality of conductive connecting materials. The plurality of conductive connecting materials can comprise a plurality of elastomer sheets. The plurality of conductive connecting materials can comprise a plurality of anisotropic conductive films (ACF). The plurality of conductive connecting materials can comprise a plurality of isotropic conductive adhesives (ICA). The plurality of conductive connecting materials attaches the plurality of MPSs to a back side of the WSII. The plurality of conductive connecting materials further provides conduction paths between pads associated with the MPSs and pads associated with the WSII. The attaching includes compressing, by an isometric grid array (IGA), each conductive connecting material within the plurality of conductive connecting materials. The compressing is based on the one or more spring-loaded fasteners. The spring-loaded fasteners can be configured to provide a desired amount of compression. The attaching couples each MPS within the plurality of MPSs to one or more functional chips within the plurality of functional chips. The MPSs can provide power to the one or more functional chips.

The plurality of MPSs is connected mechanically to a unified control board (UCB). The connecting mechanically is based on a plurality of high power sockets. The high power sockets can include high power DC sockets. The UCB includes a plurality of DC-to-DC power converters. The DC-to-DC power converters can convert a higher DC voltage to a lower DC voltage. The lower voltage can enable operation of the functional chips on the WSII. DC power is sent, by the UCB, to the plurality of functional chips. The sending is based on the plurality of DC-to-DC power converters, the plurality of MPSs, and the plurality of TSVs. The sending includes delivering the DC power, by the UCB, to the plurality of MPSs. The delivering includes a first voltage conversion. The DC power that was delivered, by the plurality of MPSs, is transferred to the plurality of functional chips. The transferring includes a second voltage conversion. The second voltage conversion can produce a DC voltage below a threshold such as 1 volt.

A cold plate can be attached to the plurality of functional chips to cool the functional chips. The cold plate comprises an inlet plate, a jet-plate, and a fin-plate. Coolant at a first temperature can be sent into at least one inlet nozzle located on the inlet plate. The sending can include spraying the coolant, by the jet-plate, on the fin-plate. At least a portion of the heat that was created can be transferred, by the cold plate, to the coolant that was sent. The coolant can be captured, at a second temperature, from one or more outlet chambers within the jet-plate.

FIG. 1 is a flow diagram for back side power delivery for wafer-scale integration with solderless modular power substrates. The flow 100 includes accessing a wafer-scale integration interposer (WSII) 110. Wafer-scale integration has been a long-sought goal of integrated circuit design. One objective of wafer-scale integration is that an entire wafer such as a silicon wafer (which can be a monolithic wafer) could be used to fabricate one large integrated circuit. However, since physical defects in the silicon wafer are distributed across the wafer, portions of circuitry which were fabricated over the defects would likely not function properly. In addition, errors that occur when fabricating the many layers that form the integrated circuit could further cause portions of the integrated circuit to likely not function. Instead, by attaching or bonding a plurality of integrated circuits to the WSII, wafer-scale integration can be achieved. This technique can further allow chips from different manufacturing processes to be included in the wafer-scale integration. In this case, the wafer can be used as an interposer to couple the various integrated circuits. The wafer can be a 300 mm wafer, a 200 mm wafer, or a wafer of another size. The wafer can comprise silicon or another suitable material. In a usage example, another suitable material can include glass. The wafer can include any amount of front-end-of-line (FEOL) processing and/or back-end-of line (BEOL) processing. The processing can be based on Complementary Metal-Oxide-Semiconductor (CMOS), Silicon on Insulator (SOI), Gallium Nitride (GaN), or another process.

In the flow 100, a front side of the WSII is bonded to a plurality of functional chips 112. The WSII can have a front side and a back side onto which elements such as the functional circuit elements can be attached, bonded, mounted, etc. The functional chips can include general purpose chips such as processor chips, multiprocessor chips, graphics processor chips, application-specific integrated circuits (ASICS), memory chips, switching chips, and so on. In a usage example, the plurality of functional chips includes one or more artificial intelligence (AI) accelerators. The AI accelerators can be used for applications such as machine learning; natural language processing; image, video, and audio processing; etc. In another usage example, the plurality of functional chips includes one or more memory devices. The plurality of functional chips can include one or more application specific integrated circuits (ASICS); one or more systems-on-chip (SOCs); optical components such as virtual-cavity surface-emitting lasers (VCSELS); and so on. In the flow 100, the WSII includes a plurality of through-silicon vias (TSVs) 114. A TSV can include an electrical connection that completely passes through a wafer such as a silicon wafer, a glass wafer, a die cut from a wafer, and so on. The plurality of TSVs can be oriented vertically in order to enable connections between the front side of the wafer and the back side of the wafer. Chips such as the functional chips can be positioned such that connections to the chips align with the TSVs. In some examples, a wafer can be ground to enable TSV processing with repeatable shapes and parasitic characteristics.

In exemplary implementations, the WSII can comprise a monolithic wafer. The monolithic wafer can include a plurality of functional cores that are fabricated on the wafer. The functional cores can include one or more processors, AI accelerators, ASICS, peripheral interfaces, and so on. The functional cores can include memory. Other memory elements, such as SRAM, DRAM, etc. can be included in the monolithic wafer. The memory elements can also be fabricated on the wafer. Interconnect can be included on the monolithic wafer to couple any number of the functional cores, memory elements, and so on. The interconnect can comprise any number of metal layers on the wafer.

The flow 100 includes attaching 120, to a back side of the WSII, a plurality of modular power substrates (MPSs). A modular power substrate can include one or more electrical elements, DC-to-DC power converters, control signals, connectors, and so on. In embodiments, the attaching is accomplished using a plurality of conductive connecting materials. In embodiments, the plurality of conductive connecting materials comprises a plurality of elastomer sheets. The plurality of elastomer sheets can enable attaching the plurality MPSs. The plurality of elastomer sheets can include a variety of materials, configurations, and so on. The elastomer sheet can comprise a conductive filament, such as brass, gold, etc., embedded in a silicone rubber sheet. The filaments can be embedded on a pitch. The pitch can be designed to match a connector array, such as a ball grid array (BGA) of the MPS. The elastomer sheet can be held in place with a compression force. An adhesive backing can be added to the elastomer sheet.

In embodiments, the plurality of conductive connecting materials comprises a plurality of anisotropic conductive films (ACFs). An ACF can include a film which is conductive and adhesive. The ACF can be activated using heat, pressure, etc. The amount of heat required to activate the ACF can include an amount of heat sufficient to cause the ACF to become slightly tacky, while the amount of heat is low enough to prevent reflow of soldered connections, further diffusion of materials, and so on. The heating of the ACF can cause conductive particles in the ACF to be trapped by prominences such as contacts. When a pressure technique is used, the amount of pressure applied enables the attaching of the MPSs. The conducting paths through the ACF can be enabled by electrical "programming" to determine conducting paths through the ACF after application of the ACF. The conducting paths can be predetermined by setting the conducting paths through the ACF prior to application of the ACF. The ACF is then placed so that conducting paths through the ACF align with contacts on the WSII and the MPSs.

In embodiments, the plurality of conductive connecting materials comprises a plurality of isotropic conductive adhesives (ICAs). A variety of ICAs can be used to accomplish the attaching. The ICA can comprise micro silver flakes. The micro silver flakes can be suspended in an adhesive such as an epoxy, cyanoacrylate, and so on. The micro silver flakes are conductive and enable power transfer, control, and other signals to be provided to and received from the power module. The ICA can comprise an epoxy-based isotropic conductive adhesive. The ICA can comprise polymer spheres. The polymer spheres can conform to irregular surfaces. The polymer spheres can conform to a TSV, a contact, and the like. The polymer spheres can be used to accomplish attaching rather than using an adhesive film.

In the flow 100, the attaching includes compressing 130, by an isometric grid array (IGA), each conductive connecting material within the plurality of conductive connecting materials. The plurality of conductive connecting materials can couple the plurality of MPSs to the WSII. The plurality of conductive connecting materials can further provide conduction paths between connection points on the MPSs and connection points on the WSSI. The compressing by the IGA can enhance the coupling, which can be adhesion, of the MPSs to the WSII and can improve reliability of the electrical connections. In embodiments, the IGA comprises a grid. In the flow 100, the attaching couples each MPS 132 within the plurality of MPSs to one or more functional chips within the plurality of functional chips. The coupling the MPSs to the one or more functional chips can be accomplished using a plurality of TSVs. Further coupling can be accomplished using interconnect associated with the WSII.

The MPSs can include electrical elements, contacts and connectors, and so on. The electrical elements associated with the MPSs can include DC-to-DC converters. The DC-to-DC converters can be arranged across a given MPS. The DC-to-DC converters can be stacked. Any number of voltage conversions can be included so that the functional chips receive power at an appropriate operating voltage. In a usage example, a first voltage conversion is accomplished by the plurality of DC-to-DC power converters. The connectors can include a high power connector. The substrate associated with an MPS to which the electrical elements, connectors, and so on are mounted can include a variety of materials. One or more MPSs within the plurality of MPSs can comprise an organic substrate. An organic substrate can be based on organic materials such as organic materials used to manufacture printed circuit boards. The organic substrate materials can include paper cores impregnated with phenolic resin, woven or unwoven glass cloth impregnated with epoxy or cyanate ester among others, natural fibers, etc. One or more MPSs within the plurality of MPSs can comprise an inorganic substrate. An inorganic substrate can be based on silicon, glass with a similar coefficient of expansion to the MPS, etc.

Each MPS within the plurality of MPSs is based on a form factor mirroring one or more corresponding functional chips within the plurality of functional chips on the front side of the WSII. The form factor can be based on one or more parameters associated with the one or more corresponding functional chips. In a usage example, the form factor can be based on a coefficient of thermal expansion (CTE). The functional chips can generate copious heat while operating. Physical components such as substrates, WSIIs, etc. can expand when heated based on a coefficient of thermal expansion associated with each material. A coefficient of thermal expansion of the UCB can be different than a coefficient of thermal expansion of the WSII. The difference in expansion coefficients can cause connectors to disconnect, C4s to crack, physical strain within materials that can cause damage, etc. Thus, if the UCB is directly mechanically connected to a WSII, the lateral displacement due to differences in thermal expansion can cause mechanical failure. Choosing an appropriate form factor for the MPSs can reduce risks of fracturing the WSII due to differing CTEs associated with the functional chips bonded to the front side WSII and the MPSs attached to the back side of the WSII. Further, the modularity of the MPSs can provide a flexible power delivery system to the functional chips which can accommodate different movements of the WSII and UCB due to thermal expansion. For example, an MPS at one side of the WSII can be decoupled from an MPS on the other side of the WSII, thus accommodating various movements across the WSII and UCB. Further, compliant connectors can be used to better tolerate lateral displacement caused by CTE differences. By attaching the plurality of MPSs to the back side of the WSII instead of the front side of the WSII, heat mitigation techniques can be applied to the front side of the WSII.

In the flow 100, each open recess within the plurality of open recesses within the IGA matches a form factor 134 of each MPS in the plurality of MPSs. As stated above, the IGA can comprise a grid. The grid can include a plurality of open recesses. The recesses can be formed such that they align with the MPSs. In one example, the MPS can be inserted into the IGA such that the back side of the MPS can be electrically coupled to the WSII via the ACF. The IGA can then exert pressure on the MPS, toward the WSII, to maintain electrical coupling.

In a usage example, ACFs are used to attach the WSII to the MPSs. In embodiments, the plurality of conducting materials can comprise a plurality of anisotropic conductive films (ACFs). In embodiments, each ACF in the plurality of ACFs comprises a plurality of conductive particles, wherein the plurality of conductive particles forms a plurality of conductive paths 136 in a single plane within each ACF in the plurality of ACFs. The conductive particles can include silver particles. Initially, the conductive particles are distributed throughout the elastomer sheets, prior to programming. The distributed particles can initially be in an "unprogrammed" state. After configuring the ACFs, the conductive particles can coalesce to form the conductive paths. Portions of the ACF from which the conductive particles have migrated from insulating regions. That is the insulating regions are substantially devoid of conducting particles. The coalescing of the conducting particles can be accomplished using heat, electrical current, and so on. Alternatively, the conductive particles within the ACF can be pre-fabricated to fit the connections of the specific application. The conductive particles can be activated by compression, such as the compression from the IGA.

In another usage example, the isotropic conductive adhesives (ICAs) are used to attach the WSII to the MPSs. In embodiments, the plurality of conducting materials can comprise a plurality of isotropic conductive adhesives (ICAs). A variety of ICAs can be used to accomplish the attaching. The ICA can comprise micro silver flakes. The micro silver flakes can be suspended in an adhesive such as an epoxy, cyanoacrylate, and so on. The micro silver flakes are conductive and enable power transfer, control, and other signals to be provided to and received from the power module. In embodiments, the ICA comprises an epoxy-based isotropic conductive adhesive. In embodiments, the ICA comprises polymer spheres. The polymer spheres can conform to irregular surfaces. The polymer spheres can conform to a TSV, a contact, and the like. The polymer spheres can be used to accomplish bonding rather than using an adhesive film.

In a further usage example, elastomer sheets are used to attach the WSII to the MPSs. In embodiments, the plurality of conducting materials can comprise a plurality of elastomer sheets. The plurality of elastomer sheets can include a variety of materials, configurations, and so on. The elastomer sheet can comprise a conductive filament, such as brass, gold, etc., embedded in a silicone rubber sheet, or another suitable material. The filaments can be embedded on a pitch. The pitch can be designed to match a connector array, such as a ball grid array (BGA) of the MPS. The elastomer sheet can be held in place with a compression force. An adhesive backing can be added to the elastomer sheet.

The flow 100 includes connecting mechanically 140 a plurality of modular power substrates (MPSs) to a unified control board (UCB). The connecting mechanically can be accomplished using plug-and-socket connectors, terminals, pins, clips, cables, and so on. In embodiments, the connecting mechanically is based on a plurality of high power sockets. The connecting mechanically can be based on a DC power connector, a high voltage socket, etc. As mentioned previously, the UCB can include one or more control circuits. The control circuits can include digital control circuits such as a processor, a multiprocessor, a microcontroller, and so on. The control circuits can control the plurality of MPSs. In the flow 100, the UCB includes a plurality of DC-to-DC power converters 142. The DC-to-DC power converters can convert DC power from a high voltage range to a low voltage range (e.g., buck conversion). In a usage example, the DC-to-DC converters can convert DC power from a high voltage range, such as 48 volts to 54 volts, to a lower voltage range, such as 12 volts to 13.5 volts. The higher voltage range can be a voltage range normally supplied to racks within a data center. In a usage example, the UCB comprises a printed circuit board (PCB). The UCB can include one or more materials. The materials associated with the UCB can include inorganic substrate materials, organic substrate materials, and so on. The organic substrate materials can include paper cores impregnated with phenolic resin, woven or unwoven glass cloth impregnated with epoxy or cyanate ester among others, natural fibers, FR-4, FR-5, etc. In a further usage example, one or more MPSs within the plurality of MPSs can include an inorganic substrate. The inorganic substrate materials can be based on a silicon glass. In another usage example, the PCB comprises ceramic. The ceramic associated with the PCB can include a coefficient of thermal expansion (CTE) similar to the WSII or other components. Similar CTEs can help to limit differences in lateral movement between layers due to heat during operation. For example, Aluminum Nitride can have a CTE that is close to silicon. In embodiments, the PCB comprises Aluminum Nitride. A PCB can perform well in circuit applications where the circuits require high current and generate substantial heat.

The flow 100 includes sending DC power 150, by the UCB, to the plurality of functional chips, wherein the sending is based on the plurality of DC-to-DC power converters, the plurality of MPSs, and the plurality of TSVs. Recall that the plurality of functional chips is bonded to the front side of the WSII. The sending power can be further based on converting one or more DC voltages. In the flow 100, the sending includes delivering the DC power 160, by the UCB, to the plurality of MPSs, wherein the delivering includes a first voltage conversion. In a usage example, the first voltage conversion can include converting a voltage in a range such as 48 volts to 54 volts to a voltage in a lower range such as 12 volts to 13.5 volts. The first voltage conversion can be controlled by the control circuits included on the UCB. The flow 100 includes transferring the DC power 170 that was delivered, by the plurality of MPSs, to the plurality of functional chips, wherein the transferring includes a second voltage conversion. The second voltage conversion can convert a voltage to a voltage below a threshold. The second voltage conversion can change the voltage that the functional chips receive to an appropriate operating level, such as less than 1 volt. The transferring can be based on a plurality of MPSs that can be bonded to the back side of the WSII. The second voltage conversion can be controlled by the control circuits included on the UCB. Chips such as the functional chips can be positioned such that connections to the chips align with the TSVs. In some examples, a wafer can be ground to enable TSV processing with repeatable shapes and parasitic characteristics.

The WSII can be brought in contact with a cold plate. The cold plate contacts the plurality of functional chips bonded to the front side of the WSII. Thus, embodiments include attaching a cold plate to the one or more functional chips. The cold plate can be used to remove at least a portion of the heat generated by the functional chips while the chips are operating. The cold plate can provide compression. In embodiments, the compressing includes mounting the cold plate to the IGA. The mounting the IGA to the cold plate can be accomplished using screws, bolts, clips, and so on. In embodiments, the mounting is based on one or more spring-loaded fasteners. The mounting can be based on one or more clamps. The clamps can provide more compression that the spring-loaded fasteners. Thus, the WSII can be held between the cold plate and the place where the WSII contacts the IGA. The holding can apply pressure on the WSII from the top and the bottom, stiffening the WSII and maintaining coplanarity.

In embodiments, the IGA comprises a compression plate. Some embodiments include stiffening the IGA, wherein the stiffening is based on a plurality of reinforcement structures. Recall that the IGA can comprise a grid. Each open recess within the grid can match a form-factor of an MPS. Each open recess can include a reinforcement structure. The reinforcement structure can include a connector such as a high power connector, high voltage connector, compliant connector, and so on. An MPS can be inserted into the IGA. The connector on the MPS can match the connector on the IGA reinforcement structure, forming an electrical connection. As described above, the back side of the MPS can be coupled to the WSSI via one or more elastomer sheets, which can be one or more ACFs. The reinforcement structure can exert pressure on the MPS toward the WSSI. The plurality of stiffening reinforcement structures can be particularly critical because the WSII can be thin. The WSII, especially when ground or polished to accommodate TSVs, can be fragile. The reinforcement structures can thus provide support for the WSII by enhancing stability, increasing stiffness, reducing the chance of cracking, enabling better electrical connections across the WSII, etc. Thus, in embodiments, the reinforcement structures on each MPS within the plurality of MPSs maintains a coplanarity of each MPS in the plurality of MPSs.

In embodiments, the cold plate comprises an inlet plate, a jet-plate, and a fin-plate. The inlet plate can receive a liquid such as a liquid coolant. In embodiments, an inlet nozzle within the inlet plate is located orthogonally to a heat extraction plane within the fin-plate. The jet-plate can create a spray which can be sprayed onto the fin plate based on holes in the jet-plate. The holes in the jet-plate can include holes of substantially similar sizes or different sizes. The holes can concentrate a spray onto a region of the fin-plate covering the functional chips. In a usage example, holes toward the center of the jet-plate can be smaller than the holes toward the outer edges of the jet-plate to account for liquid pressure differences across the jet-plate. The fin-plate can include a plurality of internal fins onto which the jet-plate sprays a liquid coolant. The fins can increase the surface area of the fin-plate, thereby enhancing removal of heat from the functional chips to which the fin-plate is attached.

The cold plate provides liquid cooling for the plurality of functional chips. The liquid can include a coolant where the coolant can be distilled water or another liquid. The coolant can be mixed with additives such as glycol. In embodiments, the attaching includes a thermal interface material (TIM). The TIM can conduct heat between surfaces, thus enabling more efficient cooling solutions. The TIM can comprise thermal tape, grease, gel, adhesive, phase change materials (PCMs), metal TIMs, pyrolytic graphite, and so on. In a usage example, the TIM can include an uncured TIM. The uncured TIM can remain flexible or viscous, thereby enabling the cold plate and the functional chips to expand by different lateral displacements based on different coefficients of thermal expansion.

Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
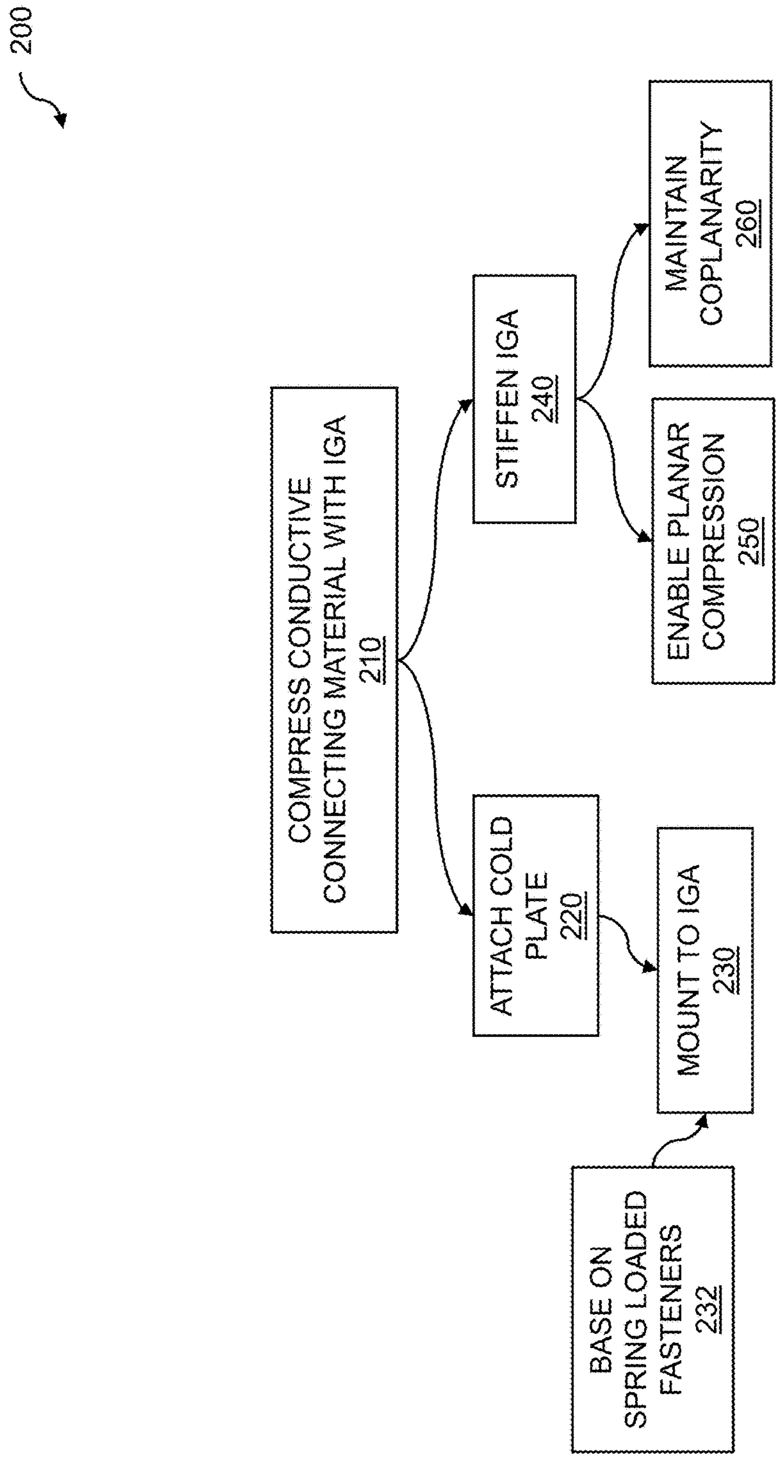
FIG. 2 is a flow diagram for compressing sheets.

FIG. 2 is a flow diagram for compressing sheets. Discussed previously and throughout, wafer-scale integration can be accomplished using a wafer-scale integration interposer (WSII). A top side of the interposer can be bonded to a plurality of functional chips, where the functional chips can include processors, multiprocessors, artificial intelligence accelerators, machine learning accelerators, and so on. The functional chips must be provided power such as DC power in order for the functional chips to operate. Modular power substrates (MPSs) can be attached to a back side of the WSSI, where the attaching is accomplished using a plurality of conductive connecting materials. The conductive connecting materials can comprise elastomer sheets, anisotropic conductive films, isotropic conductive adhesives, and so on. Power to the functional chips can be provided by mechanically connecting the plurality of modular power substrates (MPSs) to a unified control board (UCB). The UCB can include DC-to-DC converters that can convert a DC voltage to a first DC voltage. The MPSs can further include DC-to-DC converters that can convert the first DC voltage to a second DC voltage. By attaching the plurality of MPSs to a back side of the wafer-scale interposer, the DC power can be provided by the MPSs on the back side of the interposer to the front side of the interposer using through-silicon vias (TSVs). Further, the above mentioned methods and materials can enable attaching without soldering techniques, such as wave soldering, which can bend, crack, weaken, etc. existing connections such as solder bumps, C4s, and so on.

Chips such as functional chips can be bonded to a wafer-scale integration interposer (WSII). The use of the WSII supports wafer-scale integration (WSI), which is particularly useful to supporting the processing requirements of computationally intensive applications such as artificial intelligence (AI) acceleration. The functional chips that execute the computationally intensive applications require significant amounts of power during operation. The power, which includes DC power, must be sent or transferred to the functional chips. The power can be provided using modular power delivery techniques. A WSII can be brittle and difficult to handle, especially with a plurality of functional chips bonded to a front side. Further, the coplanarity of the WSII with respect to the UCB can vary, resulting in less-than-optimal electrical connections across the front side and back side of the WSII. Additionally, to support of reliable manufacture of the TSVs, the interposer can be ground and/or polished to a thinness that can support fabrication of the TSV. This technique can thin the wafer, making it more difficult to handle without cracking, especially with the additional weight of front side functional chips. Thus, the MPSs must be supported or stiffened in order to protect the wafer-scale integration interposer from cracking or fracturing. An isometric grid array (IGA) can accomplish attaching of modular power substrates (MPSs) to a back side of the WSII. The IGA can include a compression plate. The IGA can be stiffened, where the stiffening can be based on a plurality of reinforcement structures. The stiffening the IGA can be used to establish substantially equal compression across the MPS. The stiffening can enable planar compression of the MPSs, and thus planar compression of conductive connecting materials, such as elastomer sheets, ACFs, or ICAs, used to couple the MPSs to the WSII. The conductive connecting materials further provide conduction paths between the MPSs and the WSII. The reinforcement structures can also reduce the risk of fracturing of the WSII during handling, assembly, functional operation, and so on. The stiffening the MPSs enables back side power delivery for wafer-scale integration with solderless modular power substrates.

The flow 200 includes compressing 210, by an isometric grid array (IGA), each conductive connecting material within the plurality of conductive connecting materials. The compressing can be accomplished by clipping, clamping, preloading, and so on. In embodiments, the compressing is based on the one or more spring-loaded fasteners. The compressing can be based on one or more clamps which can provide more compression force than the spring-loaded fasteners. The spring-loaded fasteners and/or clamps can provide compression to enable the plurality of conductive connecting materials to reliably couple the modular power substrates (MPSs) to a back side of the WSI. The flow 200 further includes attaching 220 a cold plate to the one or more functional chips. Described previously, the cold plate provides liquid cooling based on distilled water or another liquid for the plurality of functional chips. The coolant can be mixed with additives such as glycol. In embodiments, the attaching includes a thermal interface material (TIM). The TIM can conduct heat between surfaces, thus enabling more efficient cooling solutions. The TIM can comprise thermal tape, grease, gel, adhesive, phase change materials (PCMs), metal TIMs, pyrolytic graphite, and so on. In a usage example, the TIM can include an uncured TIM. The uncured TIM can remain flexible or viscous, thereby enabling the cold plate and the functional chips to expand by different lateral displacements based on different coefficients of thermal expansion.

In the flow 200, the compressing includes mounting the cold plate to the IGA 230. Described previously, the mounting can be based on screws, bolts, clamps, clips, and so on. In the flow 200, the mounting is based on one or more spring-loaded fasteners 232. The mounting can also be based on one or more clamps which can provide additional compression force. The spring-loaded fasteners and/or the one or more clamps can be configured to provide sufficient compression to maintain attachment of the plurality of the MPSs to a back side of the WSII. The flow 200 further includes stiffening 240 the IGA, wherein the stiffening is based on a plurality of reinforcement structures. Described in detail below, a reinforcement structure can be placed in each recess within the IGA. The reinforcement structures can be deposited on the IGA, glued to the IGA, and so on. The reinforcement structures can each include crossmembers that support a centerpiece. The centerpiece can apply compression to a connector associated with an MPS. The centerpiece can include one or more holes to accommodate one or more terminals, pins, contacts, etc. associated with a power connector on the MPS. In the flow 200, the stiffening enables planar compression 250 of the conductive connecting material. Planar compression can accomplish substantially equalized compressing across the plurality of MPSs. The substantially equalized compression can stiffen the WSII at minimal risk and can enhance reliability of connections between the MPSs and the WSII. In the flow 200, the IGA maintains a coplanarity of the WSII 260. The coplanarity of the WSII reduces risk of cracking or fracturing the WSSI.

Power is sent by the unified control board (UCB) to the plurality of functional chips bonded to the front side of the WSII via the stiffened MPSs. The sending DC power can be accomplished using an interposer associated with a wafer-scale integration interposer (WSII). The WSII can include layers of interconnect fabricated on a front side and a back side of the WSII. The interconnect can include vias such as through-silicon vias (TSVs). The TSVs can provide connections directly between the front side of the WSII and the back side of the WSII. In embodiments, the sending DC power is based on the plurality of MPSs and the plurality of TSVs. The sending can include delivering the DC power, by the UCB, to the plurality of MPSs. The delivering can be accomplished using the TSVs, WSII interconnect, and so on. The delivering DC power can be accomplished by the plurality of DC-to-DC converters included on the UCB. The delivering DC power can include delivering DC power to a subset of MPSs. The delivering DC power can be accomplished by matching one or more DC-to-DC converters to one or more MPSs. Interconnection between the DC-to-DC converters matched with one or more respective MPSs can be accomplished using interconnect associated with the UCB. The sending can be based on a DC voltage.

The DC power that is delivered can include a range for the DC voltage. The range of DC voltage can include a percentage of a target voltage, an allowable operating range of DC voltage, and the like. In a usage example, the voltage range can include 48 volts to 54 volts, inclusive. The delivering can include a first voltage conversion. The first voltage conversion can include a DC-to-DC voltage conversion. The result of the DC-to-DC voltage conversion can include a DC voltage higher than the input DC voltage or a DC voltage lower than the input DC voltage. The first voltage conversion can be accomplished using the one or more DC-to-DC converters. The DC-to-DC converters can include a plurality of DC-to-DC converters connected to the UCB.

The DC power that was delivered, by the plurality of MPSs, can be transferred to the plurality of functional chips. The one or more functional chips can obtain the transferred power using interconnect, contacts, vias, and so on. The functional chips can also use interconnect and contacts to receive and send data, instructions, control signals, etc. The transferring can include a second voltage conversion. The second voltage conversion can be accomplished using one or more converters such as DC-to-DC converters associated with the MPSs. The second voltage conversion can produce a voltage that can be used directly to operate one or more functional chips. The second voltage conversion can attain a voltage less than the voltage resulting from the first voltage conversion. The second voltage conversion can result in a voltage less than a threshold. The threshold can include a target voltage, an operating voltage, and so on. In a usage example, the threshold is 1 volt. In a usage example, the transferring can be based on the plurality of TSVs. The transferring can include transferring DC power, receiving and sending data, sending and receiving functional chip instructions and control signals, etc.

Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
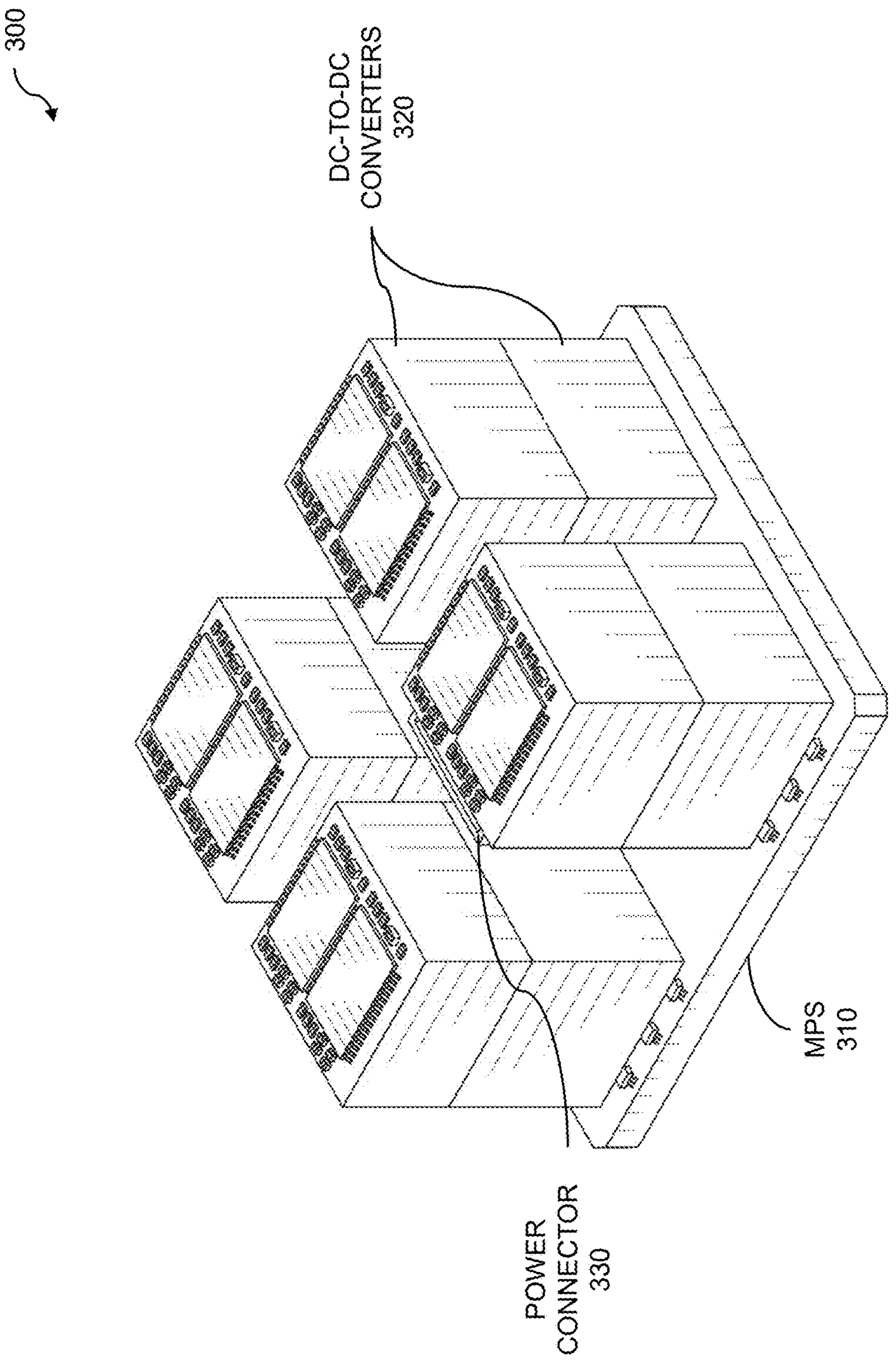
FIG. 3 is a diagram of a modular power substrate (MPS).

FIG. 3 is a diagram of a modular power substrate (MPS). Integrated circuits or "chips" such as processor circuits require power in order to operate. When a significant number of circuits is obtained to achieve an objective such as a processing objective, the power requirements for the many circuits become substantial, and the requirements for providing the power become more stringent. The power requirements can become more stringent as the aggregate power delivery to the chips can include tens, hundreds, or more amperes. Further, the many circuits to which the power is provided can generate copious heat. The heat generated by the various elements of a system such as power supplies, functional chips, and so on causes the elements to expand. Since the elements comprise different materials, coefficients of expansion of the elements can differ. To counter the potentially disastrous effects such as breakage resulting from differing coefficients of expansion, power supplies that can be used to power one or more functional chips can be arranged on one or more modular power substrates (MPSs). The MPSs can accommodate lateral displacement between other elements that expand and contract, minimizing potential material strain. Recall that a unified control board (UCB) to which the MPSs can be mechanically connected can be used to enhance the attaching of the MPSs to a back side of a wafer-scale integration interposer (WSII). The attaching is accomplished using a plurality of conductive connecting materials such as elastomer sheets, ACFs, ICAs, and so on. However, since the UCB and the MPSs can flex under compression, the MPSs can be stiffened based on a reinforcement structure at each gap in an isometric grid array. The modular power substrates enable back side power delivery for wafer-scale integration with an isometric grid array.

The illustration 300 shows a modular power substrate (MPS). Elements such as one or more DC-to-DC power converters (which can be power supplies), connectors, etc. can be mounted to an MPS 310. The number of elements that can be attached to the MPS can be based on the size, shape, and so on of the MPS. A plurality of MPSs can be used to deliver power to a plurality of functional chips. The MPS can be based on a variety of substrate materials. In a usage example, one or more MPSs within the plurality of MPSs can include an organic substrate. An organic substrate can be based on one or more organic materials such as organic materials used to manufacture printed circuit boards. The organic substrate materials can include paper cores impregnated with phenolic resin, woven or unwoven glass cloth impregnated with epoxy or cyanate ester among others; natural fibers, etc. In a further usage example, one or more MPSs within the plurality of MPSs can include an inorganic substrate. An inorganic substrate can be based on a silicon glass with a coefficient of expansion similar to the WSII, etc.

An MPS can include a form factor. Recall that a plurality of functional chips can be bonded to a front side of a wafer-scale integration interposer (WSII). A plurality of MPSs can be based on a form factor mirroring one or more corresponding functional chips, within the plurality of functional chips, on the front side of the WSII. The plurality of MPSs is coupled to the plurality of functional chips. The MPSs can be mechanically connected to a unified control board (UCB) and can also be attached to a back side of the WSII. Thus, the MPSs can be situated between the UCB and the WSII. As described above, the WSII and the UCB can have different coefficients of thermal expansion leading to different amounts of lateral movement. The differing lateral movements can be sufficient to crack connections and/or introduce warpage into components which can lead to connection failures such as disconnected connectors or cracked C4s, damage due to physical strain, etc. The modularity of the MPSs can provide a flexible power delivery system to the functional chips which can accommodate different movements of the WSII and UCB due to thermal expansion. For example, an MPS at one side of the WSII can be decoupled from an MPS on the other side of the WSII, thus accommodating various movements across the WSII and UCB.

DC-to-DC power converters 320, which can be power supplies, can be coupled to the MPS. In the figure, two power converters are shown in a stack configuration. The MPS can include additional power converters attached to the MPS at additional positions across the MPS. While stacks of two power converters are shown at each position, a given position can include no power converters, one power converter, two power converters, etc. The number of power converters attached to the MPS can be based on the dimensions of the MPS, the dimensions of the power converters, a voltage or current required by the functional chips, coefficients of expansion, heat dissipation, etc. The MPS can include one or more power connectors 330. The power connectors can fit with a high voltage socket, a high-power socket, etc. from the UCB. The power connections can include compliant power connectors, where the compliant power connectors can maintain a reliable connection even under the lateral displacement of the MPS due to heating. The power connectors can include one or more of positive terminals, negative terminals, common terminals, and so on. The power connectors can include control terminals, data terminals, etc. The high voltage socket can accommodate lateral movement due to thermal expansion.

The pressure which can engage the conductive connecting materials at the bottom of the WSII can be delivered by the MPS as the IGA pushes the MPSs into the back side of the WSII via the power connector 320 and/or the MPS substrate. The power connector can be located in the middle of the MPS, as shown in illustration 300, or in another location. However, the MPS may not be completely planar, and the force applied at the middle of the MPS may not be enough to fully engage the elastomer sheets throughout the underside of the MPSs. To maintain planarity of the MPSs and to provide uniform compression force to engage the elastomer sheets at the back side of the WSII, stiffening techniques can be applied. Embodiments include stiffening the IGA, wherein the stiffening is based on a plurality of reinforcement structures. The reinforcement structures can come in contact with the MPSs to apply substantially equal pressure across each MPS within the plurality of MPSs. In embodiments, the stiffening enables planar compression of the conductive connecting material. The plurality of reinforcement structures can enable a compression force applied by the IGA to be distributed across each MPS. The compression force can then be transferred from each MPS to one or more conductive connecting material, which can be one or more elastomer sheets, ACFs, ICAs, etc. that couple the MPSs and the WSII. The reinforcement structures can be attached to IGA, fabricated on the IGA, and so on. In a usage example, the reinforcement structure can be deposited on the IGA. The depositing can be accomplished using techniques such as chemical vapor deposition techniques. In another usage example, the reinforcement structures can be glued to the IGA. The gluing can be accomplished using an epoxy, an ethyl cyanoacrylate, and so on. In embodiments, the IGA maintains a coplanarity of the WSII.

Figure 4:
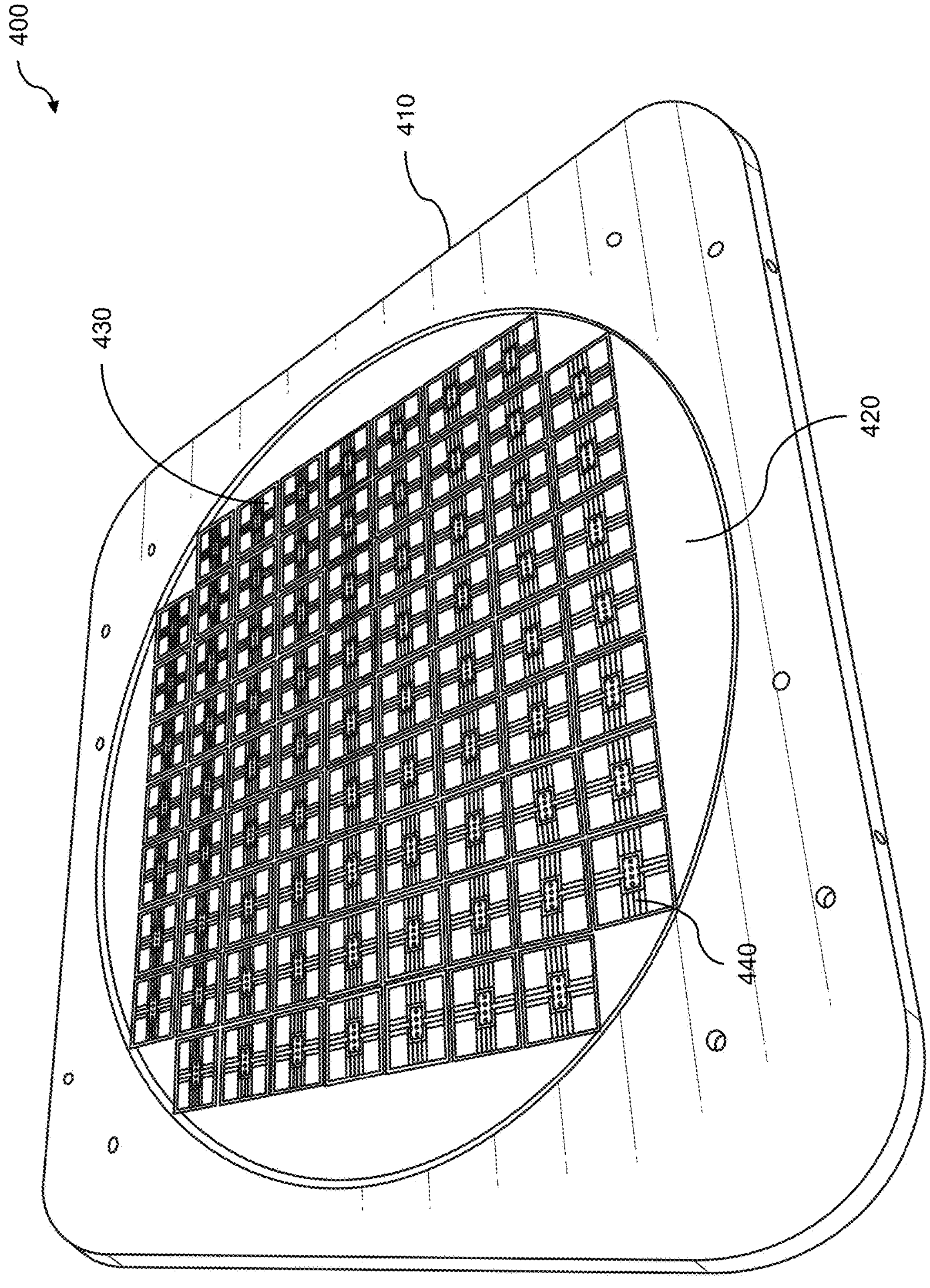
FIG. 4 is a diagram of an isometric grid array (IGA) with reinforcement structures.

FIG. 4 is a diagram of an isometric grid array (IGA) with reinforcement structures. The IGA can provide stiffening to a wafer-scale integration interposer (WSII). The WSII can include a plurality of functional chips that can be bonded to a front side of the WSII. A plurality of modular power substrates (MPSs) can be attached to a back side of the WSII. The attaching the MPSs to the back side of the WSII is accomplished through a plurality of open recesses within the IGA. Reinforcement structures associated with each recess within the IGA can apply an amount of compression to each MPS in order to ensure proper seating of connectors between the MPSs and the WSII. The walls of the open recesses within the MPSs can be sufficiently thin to minimize consumption of WSII real estate by the IGA. The walls of the IGA can further be strong enough to support and stiffen the WSII, thereby substantially reducing the risk of cracking or breaking the WSII. The cracking or breaking of the WSII can result from the thinness to which the WSII was ground, polished, and so on in order to enhance fabrication of through-silicon vias (TSVs) associated with the WSII. The cracking or breaking can also result from the weight of the functional chips and the MPSs. The TSVs enable communication between the functional chips and the MPSs. The stiffening isometric grid array enables wafer-scale integration with an isometric grid compression plate.

The FIG. 400 shows an isometric grid array (IGA) 410. The IGA can include a variety of materials such as various alloys of steel, aluminum, and so on. In a usage example, the IGA can comprise copper. Substantial heat can be generated by the functional chips and other elements while they are operating. At least a portion of the generated heat can be removed by a cold plate such as a copper cold plate. The IGA can include a recess such as a circular recess 420. The recess 420 can include a variety of sizes, where the sizes can correspond to a size of a wafer. The wafer can include a 300 mm wafer, a 200 mm wafer, and the like. The recess can accommodate the WSII. The IGA can further include open recesses such as open recess 430. The further open recesses can enable attaching a plurality of modular power substrates (MPSs) to the back side of the WSII. The sizes of the open recesses can be chosen to accommodate the MPSs and/or a lateral displacement of the MPSs that can result from heating of the MPSs during operation. In embodiments, the IGA comprises a grid. The IGA grid can include square open recesses as shown, or further shapes appropriate to a form factor of the MPSs. The further shapes can include rectangles, circles, ovals, a honeycomb, etc.

Recall that the MPSs can be based on a form factor. In embodiments, each MPS within the plurality of MPSs is based on a form factor mirroring one or more corresponding functional chips, within the plurality of functional chips, on the front side of the WSII. The form factor associated with the MPSs can also be applied to the IGA. In embodiments, each open recess within the plurality of open recesses within the IGA matches a form factor of a corresponding MPS in the plurality of MPSs. Recall that the MPSs are attached to the back side of the WSII through the plurality of open recesses within the IGA. In embodiments, the IGA contacts the back side of the WSII between each MPS in the plurality of MPSs. In a usage example, an MPS can be inserted into one or more of the open recesses within the IGA. The back of the MPSs can then be attached to the back side of the WSII via one or more conductive connecting materials such as elastomer sheets, ACFs, ICAs, and so on. If fewer than a full complement of MPSs have been inserted to the back side of the WSII, than one or more of the open recesses within the IGA can remain open. The IGA can stiffen the WSII as discussed and can provide other benefits to the WSII. Further embodiments include stiffening the IGA, wherein the stiffening is based on a plurality of reinforcement structures. An example reinforcement structure is shown 440. The reinforcement structure is discussed further below. In embodiments, the IGA maintains a coplanarity of the WSII. The coplanarity of the WSII can counteract sagging or warping of the WSII due to the weight of bonded and attached elements, and any thermal expansion of elements such as functional chips and MPSs that are bonded to or attached to the WSII.

Figure 5:
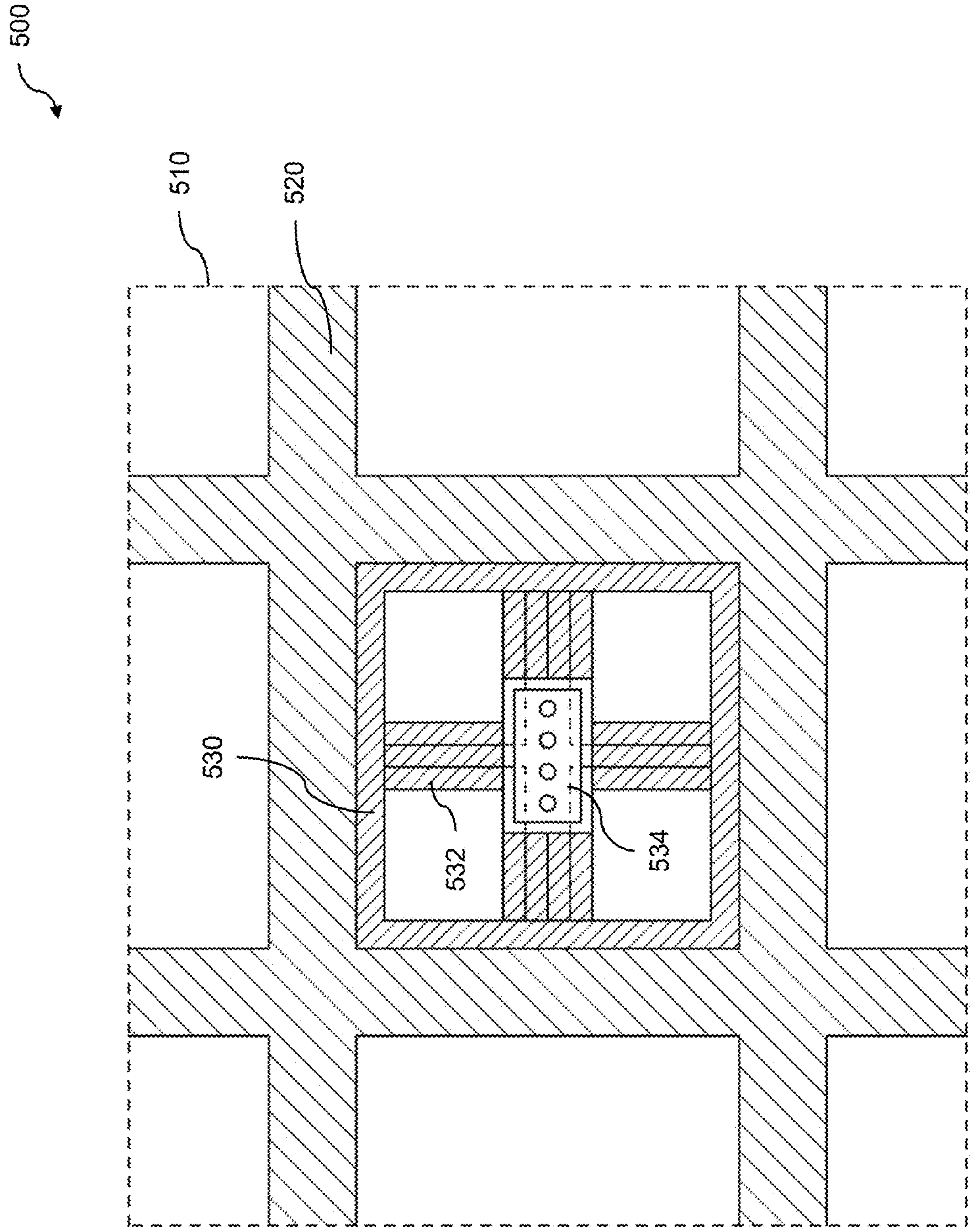
FIG. 5 is an illustration of a reinforcement structure.

FIG. 5 is an illustration of a reinforcement structure. Discussed previously and throughout, a plurality of modular power substrates (MPSs) can be attached to a back side of a WSII. The MPSs provide DC power to functional chips bonded to a front side of the WSII. The plurality of MPSs is attached to a back side of the WSII based on a plurality of conductive connecting materials. The conductive connecting materials provide coupling, which can be adhering, of the MPSs to the WSII and further provide conduction paths between contacts or pads associated with the MPSs and contacts or pads associated with the WSSI. An isometric grid array (IGA) can be used to compress each conductive connecting material to enable the attaching. Further embodiments include stiffening the IGA, wherein the stiffening is based on a plurality of reinforcement structures. The stiffening helps to protect the integrity of the WSII. The plurality of reinforcement structures can help to equalize the compressing of the MPSs across the WSII. In embodiments, the stiffening enables planar compression of the conductive connecting material. The attaching enables backside power delivery for wafer-scale integration with an isometric grid compression plate.

The FIG. 500 shows an illustration of a reinforcement structure. A detailed view of a portion of an isometric grid array (IGA) is shown 510. The IGA can include recesses, where the recesses can include square recesses, rectangular recesses, oval recesses, honeycomb recesses, and so on. In embodiments, the IGA comprises a grid 520. The grid can comprise a variety of materials such as alloys of steel, aluminum, titanium, and so on. In a usage example, the grid material can include copper. Embodiments further include stiffening the IGA, wherein the stiffening is based on a plurality of reinforcement structures. An example reinforcement structure is shown 530. The reinforcement structure can be deposited in the IGA, glued to the IGA, and so on. A reinforcement structure can be included in every recess within the IGA. The reinforcement structure can further include crossmembers such as crossmember 532. The crossmembers can fix the reinforcement structure within a recess within the IGA. A centerpiece 534 can be at the intersection of the crossmembers within the reinforcement structure. The centerpiece can include a plurality of holes to accommodate pins associated with a connector. The connector can be coupled to an MPS. The centerpiece can apply pressure to the connector, thereby enabling a more reliable connection. In a usage example, an MPS can be inserted into the plane of illustration 500. The power converters on the top of the MPS can slide through the grid structure while the power socket on the top of the MPS can mate with the centerpiece 534. The reinforcement ring can then press the MPS into the WSSI which can be coupled to the backside of the MPS.

Figure 6:
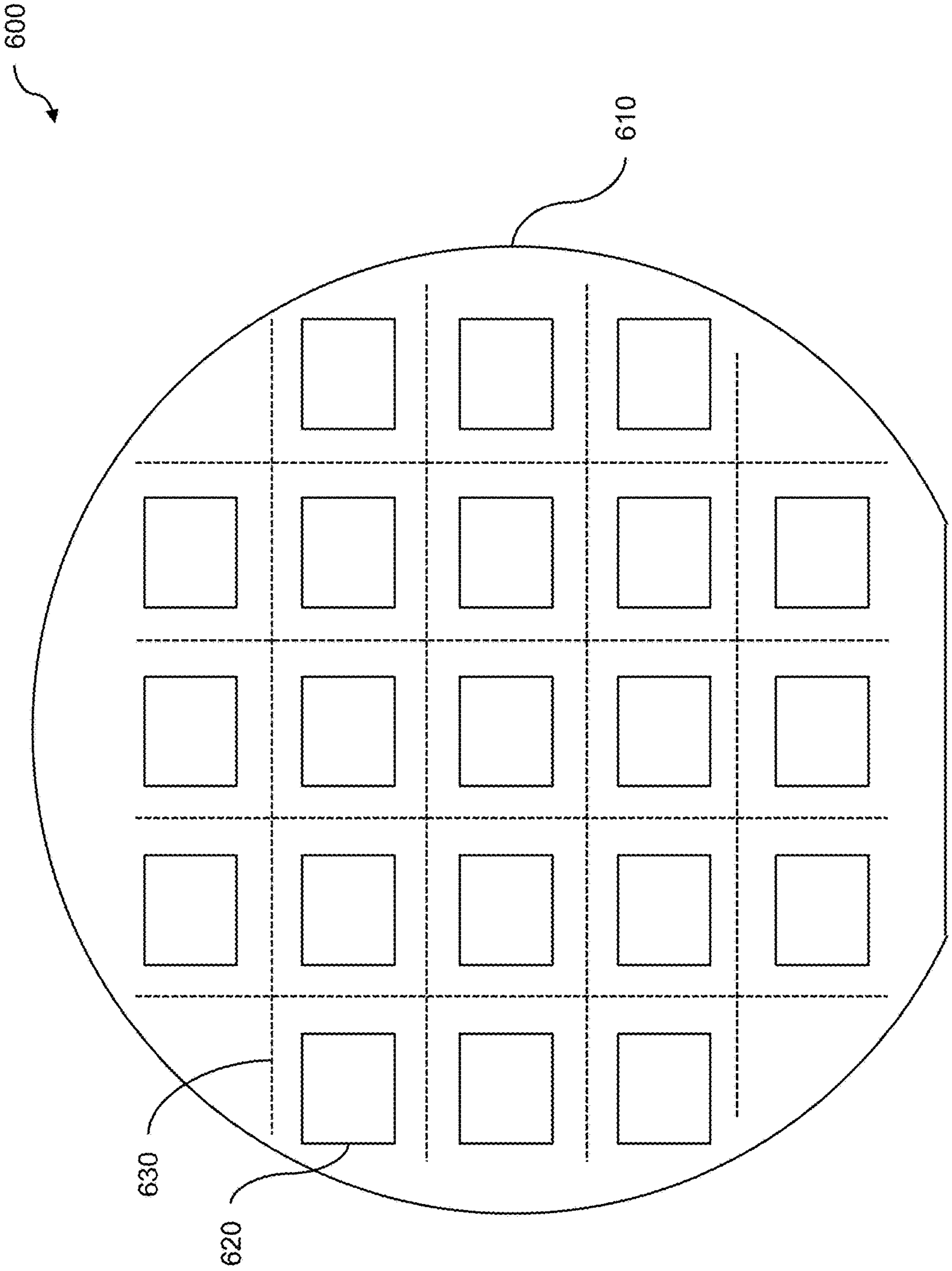
FIG. 6 illustrates a wafer with multiple die.

FIG. 6 illustrates a wafer with multiple die. A semiconductor wafer such as a silicon wafer is used in the fabrication of electronic circuits. Other semiconductor materials such as germanium, silicon carbide, indium phosphide, etc. can also be used. The wafers that are used are obtained in various sizes. One common wafer size includes a 300 mm silicon wafer. Integrated circuits or "chips" can be fabricated on the surface of the wafer by applying, removing, etc. various layers. The layers are applied to the wafer using techniques that can include diffusion, deposition, etching, planarization, and so on. The numbers of layers applied to the wafer can include dozens of layers, hundreds of layers, and so on. The layers can include active areas, polysilicon, metal, contacts, vias, and so on. The circuits are called "die" during fabrication. The die can include a plurality of similar circuits or can include two or more different circuits or "projects." The similar circuits and the different projects can include processors, memories, mixed-signal chips, and so on. The multiple die that can be fabricated on the semiconductor wafer can include accelerators for artificial intelligence and machine learning. The multiple die can be used to enable back side power delivery for wafer-scale integration with an isometric grid compression plate. Reinforcement structures associated with an isometric grid array (IGA) can be used to stiffen elements such as modular power supplies (MPSs). The reinforcement structures can be glued, deposited, or otherwise applied to each opening associated with the IGA. The reinforcement structures maintain a coplanarity of each MPS in the plurality of MPSs.

The FIG. 600 shows a wafer with multiple die. A wafer can be based on a monocrystalline semiconductor material. The semiconductor material can include a group IV material such as silicon, a group III-V material such as gallium arsenide, and so on. The die on the wafer shown are substantially similar in size. However, the die can be substantially different in size. A system can depend on a certain number of functional die. For instance, an artificial accelerator used for training a large language model (LLM) to be executed on a neural network (NN) can require a large number of functional die. The die can be comprised of AI accelerators, ML accelerators, and so on. Since a wafer will contain defects randomly distributed across the wafer, some of the die fabricated on the wafer will be affected by the wafer defects and will not function properly. By fabricating multiples of the die, the probability of fabricating at least one functioning chip increases. Further, because the presence or absence of circuits or die on the wafer can influence successful fabrication of a given die, a wafer can be "covered" with circuits for fabrication. Because of the shape of the wafer, which is typically round with at least one flat edge to aid alignment, some of the circuits may not be fully contained within the boundaries of the wafer. The resulting "partial" circuits or die will not function fully or at all. In some cases, the partial die may be usable in other applications.

A wafer is shown 610. The wafer can include multiple die such as die 620. The multiple die can be replicas of the same chip. In some cases, the multiple die can be different die, such as SRAM die. The die on the wafer can all be fabricated using the same fabrication technology. If any die requires different fabrication technologies, then that die must be fabricated on a different wafer. While 21 die are shown on the wafer, in practice any number of die can be present. The number of die will depend on the size of the wafer and the size of the die. When fabrication steps, of which there can be many, are completed, the die can be separated. The figure shows a plurality of dashed lines such as line 630. The dashed lines represent scribe lines or kerf associated with the wafer. A saw, a laser, etc. is used to slice the wafer into liberated, individual die. Since the saw or other cutting device has a finite width, some wafer material is lost due to the width of the saw or cutting device. As a result, any structures such as test structures used to track processing steps during fabrication are lost.

While multiple die are shown in the diagram, the desire to further push the size of individual die has continued at a rapid pace. As one reference point, a packaged processor chip that is larger than 35 mm on a side has become common. However, as die on a wafer become larger, the risk of individual die being impacted by defects in the wafer, or defects associated with any of the many fabrication steps, increases. How, then, could one produce even larger chips? One suggestion that has long been proposed is to use the "entire" wafer to form a single large chip or "super chip". In addition to producing the one chip on the wafer, packaging could potentially be reduced since the packaging would involve the one chip instead of a typical suite of chips, where each chip requires its own packaging. Wafer scale integration or WSI has been proposed as particularly well suited to applications that demand extensive data processing. Examples proposed that could benefit from WSI have included computer architectures appropriate for massively parallel supercomputers, and computationally intensive applications such as machine learning and deep learning. However, successful fabrication of a single chip across an entire wafer is an extremely difficult undertaking. Noted above, the widespread and random distribution of defects and other variations such as warpage across a wafer render the ability to build one "super-circuit" elusive. Also, circuit redundancy becomes a major design issue. Not only are redundant circuits that can be switched in to replace defective circuits necessary, but the locations of the redundant circuits are also critical. Note that the redundant circuits must be connected in place of the defective circuits, and that wiring on an integrated circuit is extremely expensive in terms of real estate. As a result, the placement of the redundant circuits must be carefully considered to conserve wafer real estate and to reduce wiring complexity.

Figure 7:
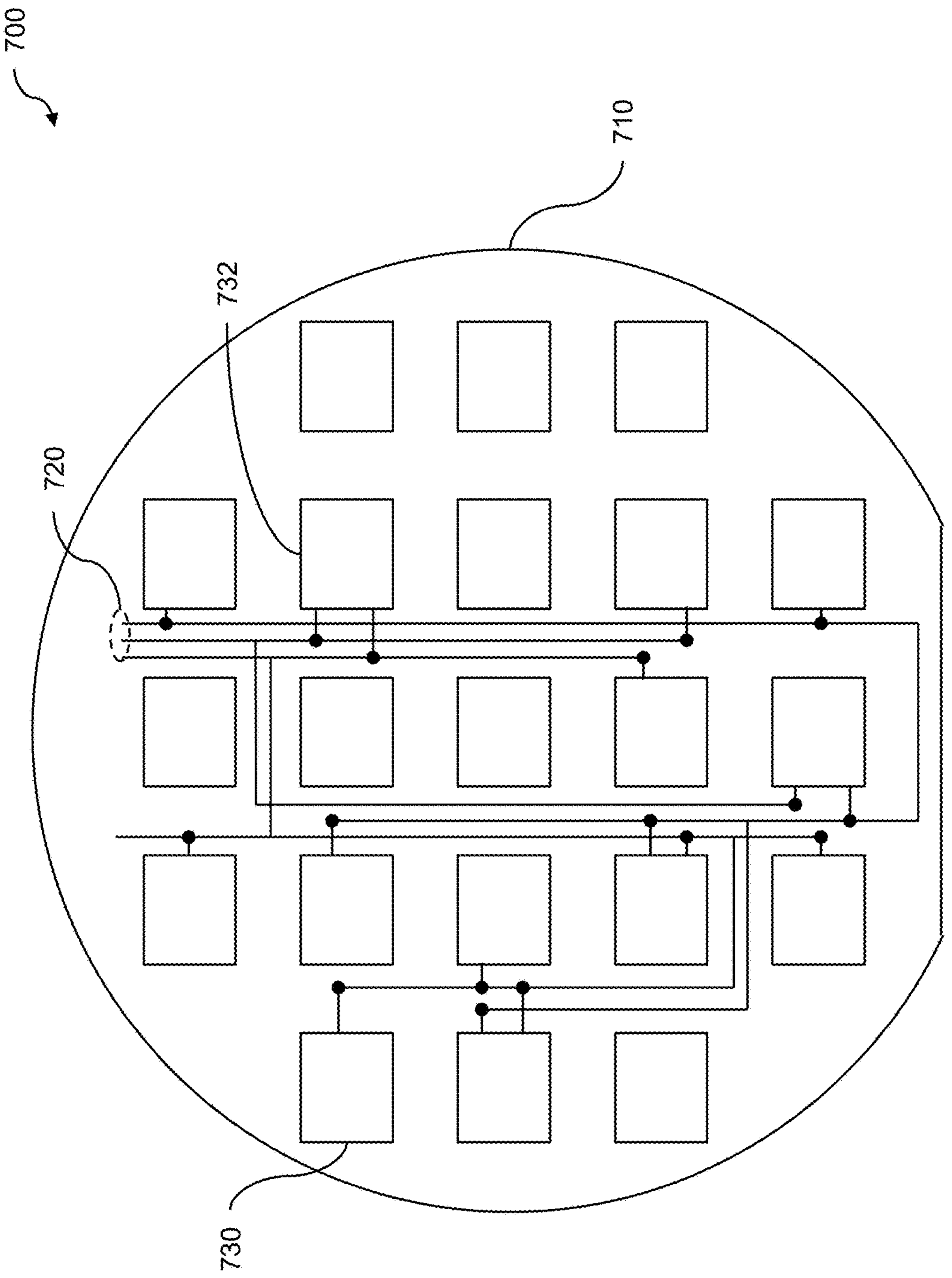
FIG. 7 illustrates inter-die interconnect for wafer-scale integration.

FIG. 7 illustrates inter-die interconnect for wafer-scale integration. Discussed previously and throughout, the demand for ever larger integrated circuits that can meet increasingly intensive processing demands has been stymied by the difficulty of producing large, single chips. One of the fundamental difficulties of producing a large chip, such as a wafer-sized chip, is that defects are randomly distributed across a wafer on which the large chip would be produced. Further, defects, such as disconnects in wiring, variations in oxide (insulator) thicknesses, open-circuit contacts, varying doping profiles, and so on, can be introduced during the fabrication process. One possible approach to "wafer-scale" integration is to continue to fabricate circuits on the wafer. Then, instead of cutting the wafer to access the individual dies, the wafer remains whole. By adopting an approach such as this one, the kerf, previously lost to the cutting of the wafer into the individual die, can be used for interconnect channels. Recall that interconnect on a wafer consumes wafer real estate that cannot otherwise be used for circuitry. By capturing the real estate previously lost to the kerf, additional wafer real estate that can be used for interconnect is captured. The interconnect in the kerf is particularly appropriate for long-haul connections, such as connections between individual die on the wafer. Since the wafer can be thinned during fabrication to enable vias, called through-silicon vias, to provide connections between a front side of the wafer and a back side of the wafer, the wafer can be reinforced. Back side power delivery for wafer-scale integration with an isometric grid array is enabled by inter-die interconnection.

The FIG. 700 illustrates use of wafer real estate, otherwise lost to scribe lines or kerf for inter-die interconnect, for wafer-scale integration. A wafer 710 is shown on which multiple die, or chips, are distributed. The die are fabricated together on the wafer. That is, each of the die on the wafer is fabricated based on the same processing steps. Since the individual die will not be separated from the wafer using a cutting technique, the kerf area of the wafer can be used for interconnect. Other areas of the die can also be used for interconnect. The interconnect 720 can be placed in wiring channels or routes, where the wiring channels are realized in what would formerly have been the kerf. The wiring channels include wafer real estate in which interconnecting wire can be placed. The interconnect can be fabricated while the various die on the wafer are fabricated. The interconnect can include a plurality of wiring layers. The various layers can be interconnected using contacts, vias, and so on. In the figure, a few example interconnecting runs are shown. The various die on the wafer can make connections to the wiring channels. In the figure, die 730 can use the wiring channels to connect to die 732.

Figure 8:
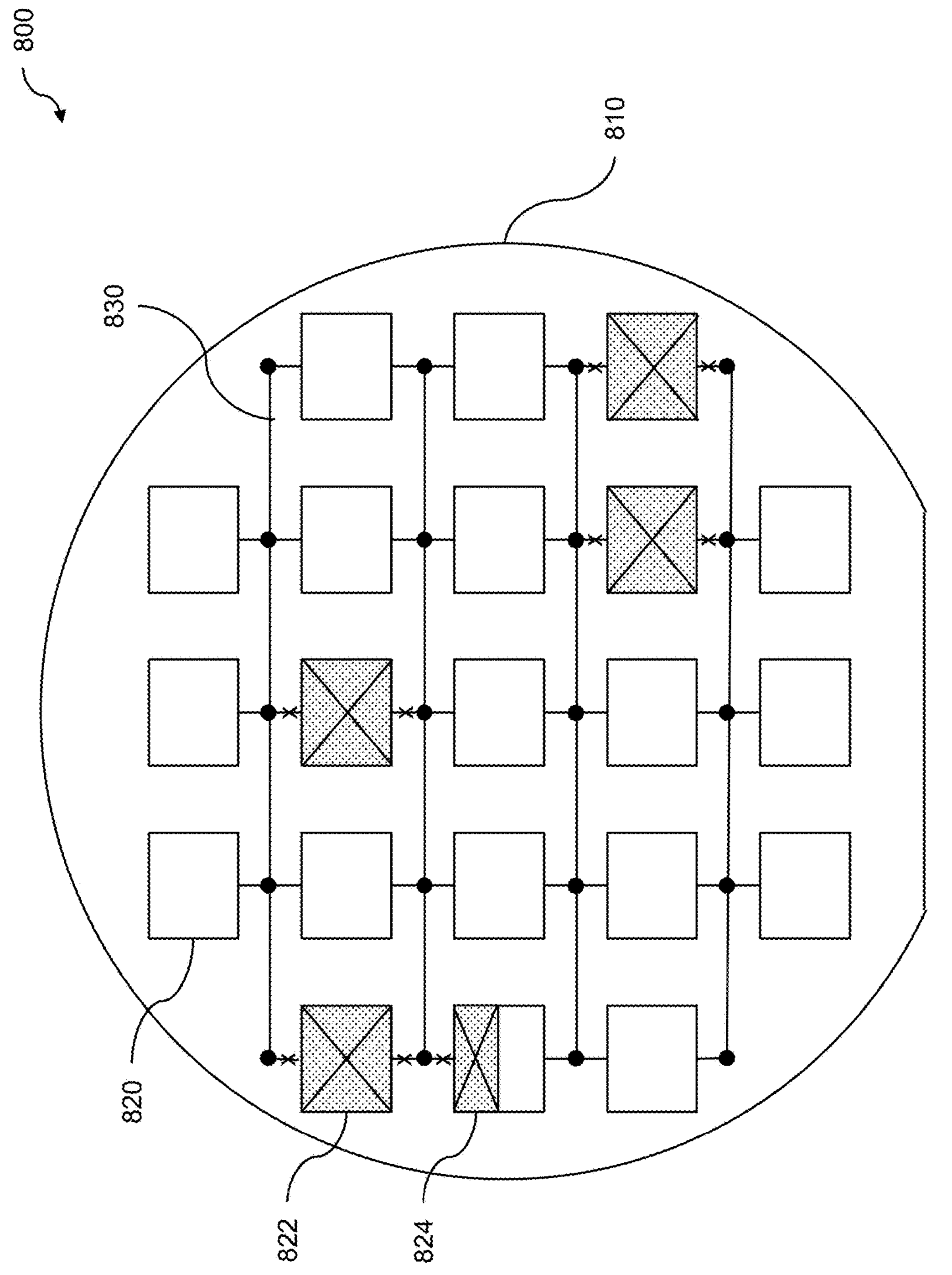
FIG. 8 shows inter-die interconnect and redundancy for wafer-scale integration.

FIG. 8 shows inter-die interconnect and redundancy for wafer-scale integration. Building on the previous discussions of techniques including fabricating redundant die on a wafer and of using the kerf for interconnect, a technique for wafer-scale integration (WSI) can be based on fabricating redundant die on the wafer, and selecting the working die for use by a system based on WSI. Working die can be selected while non-working die, partial die, and other substandard die can be electrically ejected from the system by deselecting the die. The deselecting can include disabling wired connections to the unused die, physically "blowing" connections to the unused die (e.g., a fuse), and so on. The remaining functioning die can be interconnected using inter-die interconnect to form a system on the wafer. The system on the wafer can achieve the desired objective of wafer-scale integration. Power, data, control signals, and so on can be provided to the selected, working die. Due to the size of the wafer on which the interconnected die are fabricated, the wafer can be subject to warping, cracking, breakage, and so on. The wafer can be supported or stiffened such that risks of damage to the wafer and the die on the wafer can be minimized. Further, connections between the wafer and elements such as power supplies, DC-to-DC converters, controllers, and so on can be established using selectively conducting elastomer sheets. Inter-die interconnect and redundancy to support back side power delivery for wafer-scale integration are enabled with an isometric grid array.

The FIG. 800 shows redundant die and inter-die interconnect. A wafer is shown 810. The wafer is populated with multiple die such as die 820. A number of the die shown can be redundant. Some of the redundant die will include defects, can be incomplete, can miss specifications, or can otherwise fail. The defects can be associated with the wafer on which the die are fabricated, associated with one or more processing steps for fabricating the die, and so on. This can result in die that are not operational, such as die 822. Recall that die can be fabricated on the wafer in order to ease some fabrication complexities, and that some of the added die can include partial die such as die 824. The failed die and the partial die can be excluded from a system formed by wafer-scale integration (WSI). In some cases, a die such as 824 can be partially functioning. The portion of the die that is functioning can be included in the WSI, while the portion of the die that is not functioning can be excluded. The functioning die can be inter-connected using inter-die interconnect 830. The inter-die interconnect can include multi-layer interconnect. The inter-die interconnect can be placed between the die associated with the multiple projects. Functioning die can be connected to the inter-die interconnect, while non-functioning die can be disconnected from the inter-die interconnect.

Figure 9:
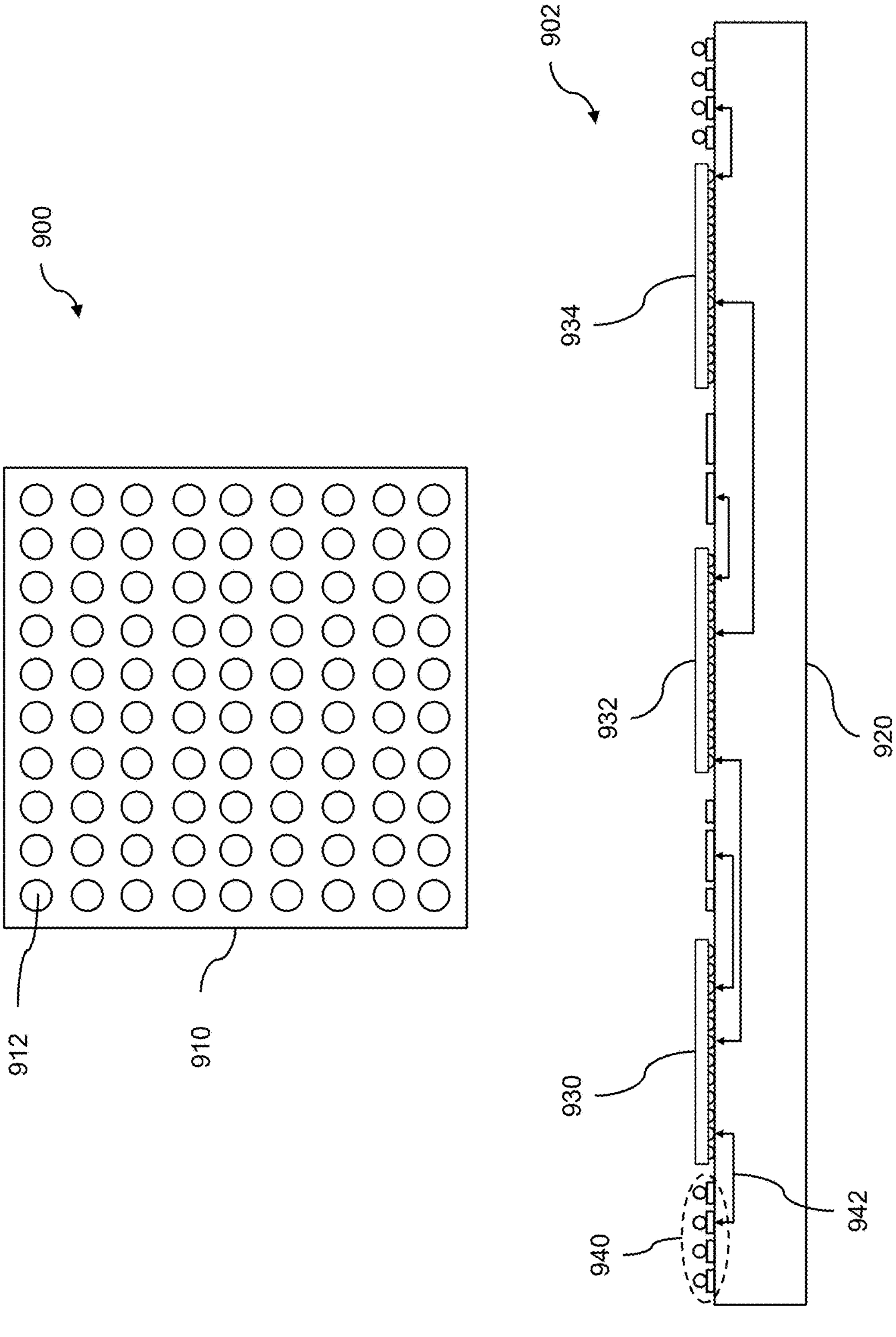
FIG. 9 illustrates a flip-chip and interposer with flip-chips for wafer-scale integration.

FIG. 9 illustrates a flip-chip and interposer with flip-chips for wafer-scale integration. One technique that can be used to approach the benefits of wafer-scale integration is to attach more than one chip to a common substrate or interposer. The substrate can include a wafer, a carrier, a circuit board, and so on. To accomplish such a technique, all interconnections to a circuit or chip, including data connections, control and signal connections, power connections, and so on, can be made at the top layer of the chip. The connections at the top of the chip replace the traditional placement of pads at the periphery of the chip. To connect the top connections of the chip to the interposer, solder balls are placed on the top connections and the chip is inverted or "flipped." The solder balls, when melted, can connect the top connections of the chip to corresponding connections or pads on the interposer. Further chips can be similarly flipped and connected to additional corresponding connections on the interposer. One challenge to the flip-chip technique is providing power to the chips. The power can be provided using back side power delivery for wafer-scale integration with modular power substrates (MPSs). A further challenge to the flip-chip technique is that the aggregate weight of the flipped chips can be sufficient to pose a risk to the delicate wafer or interposer. The wafer can be stiffened in order to protect it from the weight of the flipped chips. The stiffening can be accomplished using an isometric grid array (IGA). The IGA can include a plurality of reinforcement structures. The plurality of reinforcement structures enables planar compression of each elastomer sheet within a plurality of elastomer sheets. The elastomer sheets enable attachment of the plurality of MPSs to a back side of a wafer-scale silicon interposer (WSII). The back-side power delivery for wafer-scale integration is enabled with an isometric grid compression plate.

The FIG. 900 includes an example flip-chip. Discussed previously, the flip-chip 910 differs from a traditional chip in that the connections to the flip-chip are made at the top of the chip rather than to pads located at the periphery of the chip. A top view of a flip-chip is shown. The top can include pads that can be connected to corresponding pads on a multi-chip module, a circuit board, an interposer, and so on. An example contact or pad 912 is shown. Multiple pads can be distributed across the top of the flip-chip. The pads can be oriented to correspond with receiving pads on the interposer. An array of pads is shown. In a usage example, a subset of pads can be required to connect the flip-chip to the interposer. Thus, required pads are present at the top of the flip-chip, while the unused pads can be omitted from the top of the flip-chip.

The illustration 902 shows an example interposer. As discussed previously, the interposer 920 can include a wafer, a carrier, a circuit board, and so on. One or more flip-chips can be attached to the interposer. In the figure, the flip-chips can include a first flip-chip 930, a second flip-chip 932, a third flip-chip 934, and so on. While three flip-chips are shown, other numbers of flip-chips can be attached to the interposer. In a usage example, the flip-chips can be attached to the interposer in a grid pattern. In addition to serving as a placement location for the flip-chips, the interposer can provide interconnect. The interconnect can be used to provide signals such as control signals, data, and so on to the flip-chips. The interconnect can further provide power to the flip-chips. Depending on the interposer used to receive the flip-chips, the interposer can include one or more layers of interconnect. The interconnect can include interconnect at a top surface of the interposer such as top surface interconnect 940. The interposer can further include additional layers of interconnect. The additional layers of interconnect can be fabricated on the interposer. The additional layers of interconnect can be isolated from each other using an insulating layer between the conducting interconnect layers. An example "lower layer" connection 942 is shown.

The use of flip-chips attached to an interposer can enable multichip module (MCM) techniques. A multichip module can refer to a substrate, carrier, circuit board, interposer, etc. onto which multiple ICs can be placed. The multiple ICs can be attached to the interposer, and the multiple ICs can be wired together using interconnect provided by the interposer. The interconnect associated with the interposer can provide power, control signals, and data between and among the ICs that are attached to the interposer. The power can be provided using modular power techniques. Depending on the particular type of MCM, the interposer can further include discrete components such as discrete resistors, discrete capacitors, discrete inductors, discrete diodes, etc. The interposer further includes wiring for interconnecting ICs and the discrete components, if any. The MCM can be packaged and used as if it were a single IC on a board such as a circuit board within a system. MCMs have also been referenced as heterogeneous integration circuits and hybrid integrated circuits. A principal advantage of using MCMs is that multiple electronic components can be enclosed in a single "chip," thereby improving modularity of a system design. Also, the use of MCMs can improve IC yields over ICs produced using monolithic IC design methodologies.

There can be several varieties of MCMs, where the MCM varieties are typically differentiated by size, complexity, design methodology, and so on. At one end of the complexity scale, an MCM can include standard off-the-shelf ICs. The ICs can be attached to a circuit board such as a printed circuit board and can be used in place of an existing chip or package of chips. The printed circuit board can be designed to match the size and pin-out of the existing chip or package of chips. An MCM can also be a complex element. The complex MCM can be based on one or more fully customized IC packages. The fully customized IC packages can be used to integrate multiple IC dies (e.g., unpackaged ICs) onto a substrate that provides interconnection among the dies. Because of the wiring requirements of the multiple IC dies, the substrate typically includes high density interconnection (HDI). The substrates that are used for the MCM can include thin films for interconnects (wires) and dielectrics (insulators); thick films that enable more than one layer of interconnect and ceramic; and substrates that include laminates based on organics or plastics. The MCM based on thin films of interconnects and dielectrics can result in the highest circuit densities.

The MCM design concepts described previously suggest promising leads for implementing wafer-scale integration ICs. Multiple circuit dies could be fabricated within the same wafer. The wafer could further include built-in self-test (BIST), circuit redundancy to provide spare parts, and "self-rerouting." The self-rerouting can "reroute" around defective, incomplete, or failed elements and can wire in known good spare parts. In order to enable such capabilities, a significant number of interconnect layers would be required for WSI. Interconnect layer counts of approximately ten layers have been predicted. In order to implement WSI in a cost-effective manner, several techniques have been proposed, such as using an artificial neural network to develop a programmable topology, using a multichip-scale package, and so on.

Another technique that is being developed to enable wafer scale integration is based on the use of a silicon interposer, as discussed above. The interposer can further include an interposer based on other materials such as glass. The silicon interposer, which can be a wafer, can be used to provide interconnections among a wide variety of components. The components include integrated circuits (chips), chiplets, power supplies, power converters, discrete electrical components, and so on. The interposer provides connection points that can be used to mechanically and electrically mount the chips, chiplets, etc. The interposer can be formed from inorganic materials such as glass or silicon, or organic materials such as those used to manufacture printed circuit boards. The electrical connections can be set to a pitch to simplify the attaching of the electrical elements. The electrical connections can be based on standardized manufacturing techniques such as using solder balls, micro-bumps, controlled collapse chip connection (C4) bumps, and/or electroplated bumps. The bumps on a chip are produced on the "top" side of a wafer (e.g., the non-substrate side) as a final processing step for the wafer. To mount the chips to the interposer, the chips are "flipped" using a flip-chip technique. The bumps at the top of the chips connect to pads on the interposer. The interposer can enable connections from the flip-chip to a standard connection arrangement such as a grid. The interposer can further provide one or more layers of interconnect according to the process used to manufacture the wafer. Thus, higher densities, higher bandwidth, and faster speeds can be achieved. The layers of interconnect are used to provide power and ground, control signals and data, and so on.

Figure 10:
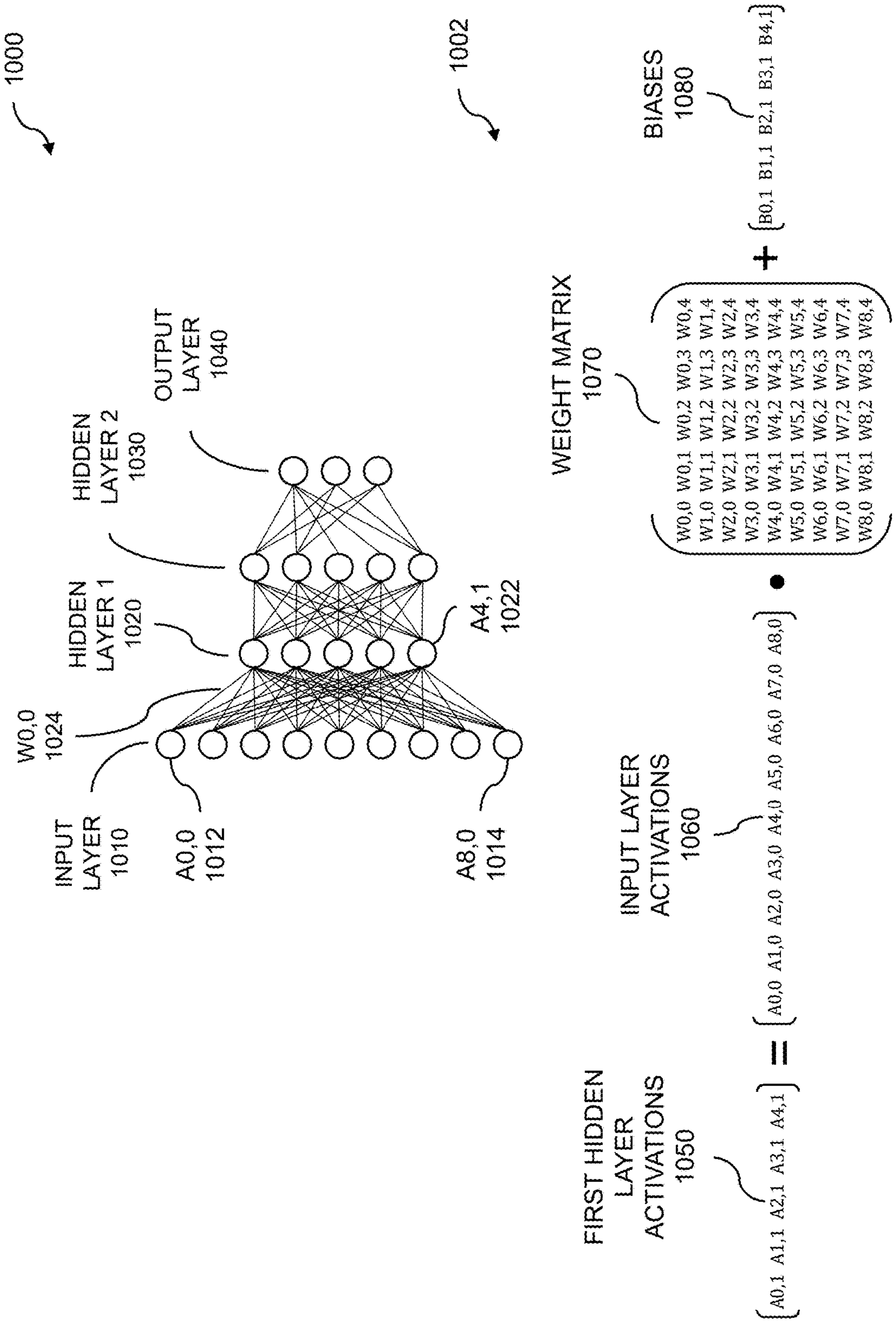
FIG. 10 is an illustration of a neural network.

FIG. 10 is an illustration of a neural network. The neural network (NN) can include a convolutional neural network (CNN). A convolutional neural network can be configured as a type of deep learning system. The deep learning (DL) system can learn or be "trained" using data such as training data provided to the system. The training data can be provided along with "known good" or expected inferences and results. CNNs can be extensively used for image and video recognition, image classification, image segmentation, natural language processing (NLP), and so on. A CNN can use a few (such as tens), or many (such as hundreds, thousands, etc.) of layers of processing units called neurons. The neurons can accomplish calculations which can determine a weighted sum of inputs. The inputs to the neurons can include inputs to the CNN or outputs from previous layers of neurons. The neurons can include a bias which can determine or alter the impact of a neuron on a future neuron (e.g., a neuron in a subsequent layer of the CNN). The neuron can include an activation function such as a sigmoid function, a rectified linear unit (ReLU) normalization function, a hyperbolic tangent (tanh) function, and so on. The activation function is used to ensure that the value calculated by the neuron remains between 0 and 1. The value stored in the neuron can be called an "activation." The neuron can process any type of data including any floating-point format such as single precision floating-point, double precision floating-point, brain floating-point 16 (BF16), BF8, and so on. The neurons can be arranged into layers. The layers can include substantially similar numbers of neurons or different numbers of neurons. The output of a neuron in one layer can be used to feed one or more neurons in another layer. One or more layers can comprise fully connected layers where a neuron in a first layer is connected to each neuron in a previous layer. The various layers and connections between layers can form the basis of an inference operation by the neural network. The neural network can be enabled by back side power delivery for wafer-scale integration with an isometric grid compression plate.

The illustration 1000 shows an example CNN comprising groups of neurons arranged by layers within a network architecture. The input data for a neuron can come from an original data source, such as a video image, or from a previous layer of neurons. The output value from each neuron can be used to feed one or more neurons in another layer of neurons, or can be part of a final output layer. In the illustration 1000, the first layer at the left of the figure can be called the input layer 1010. Each neuron or processing unit in this layer can receive data directly from a source such as a still camera, video camera, passive infrared (PIR) camera, and so on. Neurons can be numbered for identification. For example, 1012 shows a neuron which contains an activation for the first layer at a first neuron. Thus, this neuron can be labeled A0,0. In a similar manner, 1014 shows neuron A8,0, which can refer to the ninth neuron in layer 0. This can indicate that there are nine neurons/activations in the first layer (e.g., "layer 0") of the neural network. In practice, any layer can contain any number of neurons. The number of neurons in a given layer can be heuristically determined. Large CNNs can have thousands or millions of neurons at the input layer.

The numeric values calculated by each neuron (called activations) in the input layer can become the input for the next layer of neurons. The next layer of neurons can be a hidden layer. Any number of hidden layers can be included in the neural network. In the illustration 1000, the first hidden layer is hidden layer 1 1020 and includes five neurons. A second hidden layer 1030 is included which also has five neurons. A final layer, an output layer 1040, is shown which includes three neurons. The output layer can comprise the final inference from the neural network. For example, if the neural network depicted in 1000 comprises a system for determining whether a traffic light was red, yellow, or green, the top activation function/neuron in the output layer could be for red, the middle could represent yellow, and the bottom green. The final value found in each activation within the output layer can comprise a probability. For example, the final output layer could comprise values (from top to bottom) such as 0.01, 0.2, and 0.99. The strength of the network prediction can grow the closer the output value is to 1. Thus, the neural network in this case can indicate a high probability that the light is green.

In practice, any number of neurons can be included in any number of hidden layers. A hidden layer within the CNN can include a truncation layer, a bottleneck layer, and so on. The illustration 1000 shows that every calculated value from the input layer is connected to every neuron in the first hidden layer. The first hidden layer is described as a fully connected layer. Each connection can be associated with a weight and a bias. Weights and biases can determine how much the value in the current neuron should affect other neurons in the next layer. Thus, the connection between A0,0 1012 and A4,1 1022 can include a first weight, while the connection between A8,0 1014 and A4,1 can include a different weight. A unique bias can be associated with A4,1. The weights can be labeled to make it clear which nodes are coupled between a previous layer and a current layer. For example, for the first hidden layer, W0,0 1024 can couple neuron 0 from the input (previous) layer to neuron 0 in hidden layer 1 (the current layer).

In a similar way, the value for each neuron in the first hidden layer can be determined by a large matrix multiply function as shown in illustration 1002. Each activation function in the first hidden layer can be represented by a 1-dimensional vector such as is shown at 1050. The activations from the input layer can be shown in another 1-dimensional matrix such as at 1060. A 9×5 matrix, which includes all weights between the first input layer and the first hidden layer as shown at 1070, can be created. In practice, the weights can comprise any number of rows and columns according to the size (e.g., number of neurons) of the layers. Finally, the biases associated with each connection from the input layer to the first hidden layer can be represented in a 1-dimensional matrix such as 1080. For example, in the illustration 1000, the value of A4,1 1022 can be the sum of all the weighted (W) inputs from the previous layer, with a final bias added as shown in the following equation: A4,1=[(A0,0*W0,4)+(A1,0*W1,4)+ . . . +(A8,0*W8,4)+B4,1]. As stated previously, the activation A4,1 can include a non-linear transformation such as a sigmoid, ReLU, Tanh, and Softmax. The non-linear transformation function can ensure that the value of the activation remains between 0 and 1 and does not "saturate" with a value or 1 or a value of 0.

Each transition to a different layer within the neural network can require a different matrix multiplication function. Thus, a neural network with many layers can heavily tax a processor core. As the number of neurons/activations within the layers grows, the matrix multiplication function grows increasingly complex. For example, the total number of weights and biases in a neural network can be called the number of parameters in the system. In the case of illustration 1000, relatively few parameters have been included. In the first layer, each of the nine neurons is connected to five neurons, with each connection including a weight. A separate bias can be included for each of the five neurons. Thus, in an example configuration, the first layer can include 9×5+5=50 parameters. The second layer includes five neurons connected to another five neurons at the next layer, each connection including a weight. Again, a bias can be included for each neuron. Thus, the parameter count for the second layer as shown is 5×5+5=30. The third layer comprises five neurons with each neuron connected to three neurons in the output layer, where each connection also includes a weight. A bias can be included for each of the three neurons. Thus, the number of parameters is 5×3+3=110. Accordingly, the number of total parameters in the system can be 50+30+18=98.

Consider a large neural network used for modern large language models. As these networks can comprise billions or trillions of parameters, the matrix multiply function can be exceedingly large. To lessen processing bottlenecks, the matrix multiply functions required, which can include matrices with hundreds, thousands, or even millions of rows and columns, can be separated based on submatrices and can be distributed across many special purpose processors. This technique can decrease the processing time required to perform each matrix multiply. However, this approach can drive bandwidth requirements between many processors and many memory chips as the single large matrix multiply can be split, sent to many processors for execution, collected at a central processor, and then the result must be combined. In large neural networks, this can occur for every inference, driving large memory bandwidth requirements. For example, if 1 billion parameters are used in a neural network, each saved in a single precision floating point format (32-bits), the resulting model could require tens of megabytes (MB) of memory simply to store the parameters of the network. A neural network with 1 trillion parameters could require tens of gigabytes (GB) of memory. As discussed below, training the neural network can drive the need for additional bandwidth as each processor must keep a copy of the previous activations, weights, and biases that are required to perform a matrix multiply. In addition, the training data, which can also be quite large, must be sent. In sum, while neural networks have driven processor improvements, especially in matrix multiply efficiency, the bandwidth needed to keep each processor occupied in a large neural network remains a significant challenge. This can be especially true for some neural networks such as transformers. In these cases, bandwidth requirements of running inferences can place a larger demand on the system than even training (as described below).

Figure 11:
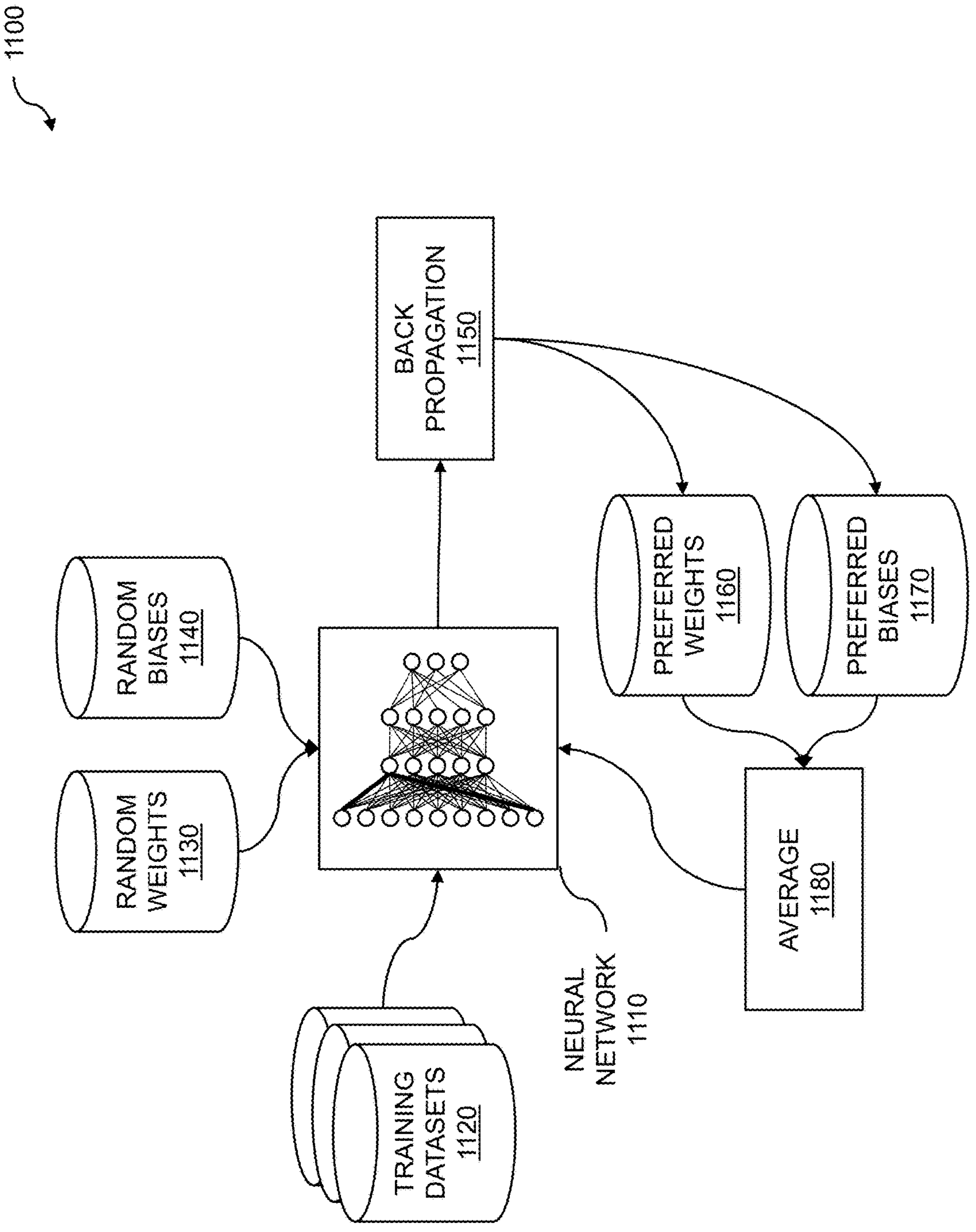
FIG. 11 is an example of training a neural network.

FIG. 11 is an example of training a neural network. A neural network can be trained to accomplish a task. The training the neural network can be based on providing training data and "known good" classifications, inferences, and so on. The task can include identification of objects within an image, facial recognition or speech recognition, data classification, and so on. A neural network, as previously described in illustration 1000 above, is shown in example 1100 at 1110. The neural network can comprise any number of neurons/activations. The neurons/activations can be organized in layers. Training datasets 1120 can be provided to the neural network to train the neural network. The training datasets can be based on the type of inference required from the neural network. The inference can be based on a classifier. For example, if it is desired for the network to identify a type of animal, then the training set can include many different types of animals in many different environments, different views of the animals, different numbers of animals, etc. In practice, a large amount of data is required to train a network to properly perform an inference. For example, in video processing/recognition, a rule of thumb can be ten training images per parameter. Thus, a small neural network with 1,000 parameters could have 10,000 images or more for training. If these images are large, the memory requirement to store them can also be large. For example, 10,000 8-bit greyscale images in a resolution of 720×720 pixels could require: (8-bits/pixel)×(518,400 pixels/image)×(10,000 images)=40.5 GB. The memory requirement would be higher for color images such as RGB images or for higher resolution images. To train a neural network, each of these images can be sent to the input layer of the neural network for training, requiring wide and fast memory connections to the processors performing the training. The training can include training a neural network configured on processors within wafer-scale integration. The training the neural network is supported by back side power delivery for wafer-scale integration with an isometric grid compression plate.

The neural network can begin with a random set of weights 1130 and biases 1140. In some embodiments, a previous set of weights and biases may be used or may have been obtained prior to training. The previous set of weights and biases can be used in place of purely random values, thereby speeding the training of the neural network. The training process can alter those weights and biases such that an accurate inference can be performed with inputs that the neural network has not previously seen. To train the network, a first image from the first training dataset can be sent to an input layer, as described in the previous figure. Each layer of the neural network can then calculate values based on a weighted sum of each connected neuron in the previous layer. This calculation continues until all neurons in all layers have generated an input. The final values can be captured at the output layer of the neural network. The training can comprise a supervised training. In supervised training, a desired output for each neuron in the output layer can be pre-determined along with each training image. The pre-determined desired output can be a label. A cost function can be created for each training image, which can be obtained by adding the squares of the differences between the result of each neuron in the output layer and the desired result (which can be found in the label of the training data) of that neuron.

The training seeks to reduce the cost function associated with every training image by determining a gradient of the cost function for each image. This can be computed by back-propagation 1150. The back-propagation process can determine, for each neuron in the network, what changes should be made to its associated weight and bias to reduce the cost function most effectively. Since a neuron in a layer N is affected by the previous layer N−1, the neurons in N−1 must also be adjusted. Thus, back-propagation can be an iterative algorithm starting from an output layer of the neural network and ending at the input layer. To train the neural network, each image can be processed forward through the neural network and then back-propagated through the network to determine changes necessary for a more accurate inference in the future, such as for a next image. This process can be repeated for each image in the training set. Because of the large amount of data required to keep all images in memory, the training data can be randomly divided into datasets which can also be referred to as “mini batches.” Training the network can take place on one mini batch at a time to lower bandwidth and compute requirements. For example, the neural network can perform forward processing and back-propagation on the first training image within the first mini batch, resulting in a first set of preferred weights 1160 and biases 1170. The preferred weights and biases can reflect a desired value for the weight and bias at every neuron to enable more accurate prediction of an output based on the first training image within the first mini batch. The neural network can then perform the same function on a second image, resulting in a second set of preferred weights and biases. This process can be repeated for each image in the mini batch. Once each image in the mini batch is processed, an associated set of preferred weights and biases is computed. Each preferred weight and bias for each node can be averaged 1180 to determine the final adjustment that will be made to the actual weights and biases in the network due to the mini batch of images. Once the neural network is updated, another mini batch of training images can be used to further train the network in the same way.

In a usage example, consider a large neural network with billions of parameters and with large matrices that must be calculated to determine each activation. Further consider the large amount of training image data that must be sent to the network and the amount of data that must be maintained during training (including the intermediate weights and biases for each node resulting from each training pass of each image in a mini batch prior to averaging). Finally, consider that a large neural network can be distributed across many functional processors, all with a need to access a relevant portion of the data described above. The memory access and bus or network bandwidth requirements for training such a neural network are extremely high. New methods and technologies can be required to feed such a distributed network.

Figure 12:
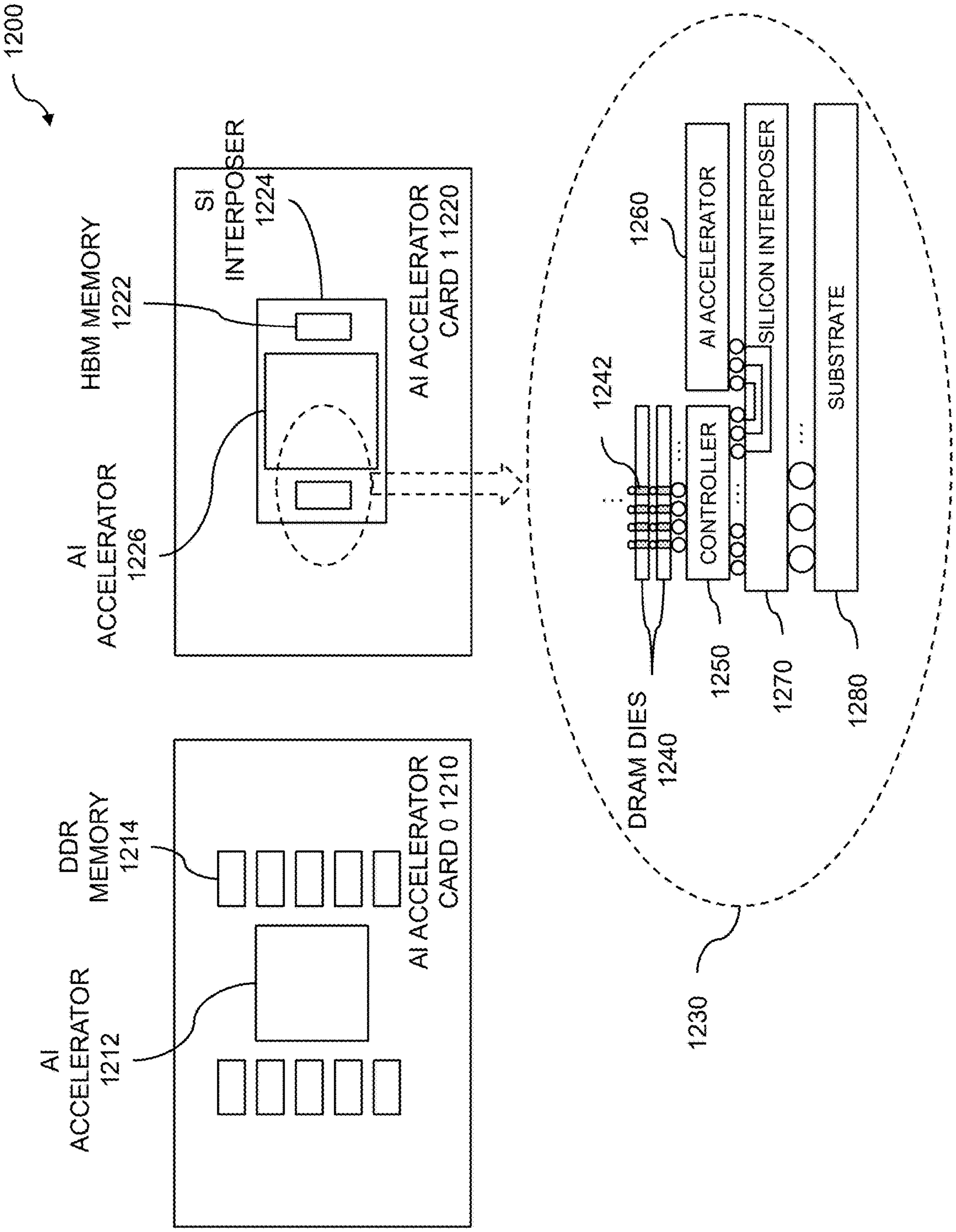
FIG. 12 is an example of enhancing memory bandwidth.

FIG. 12 is an example of enhancing memory bandwidth. As discussed above, modern large neural networks can include billions or even trillions of parameters, requiring many gigabytes of memory or terabytes of memory simply to store the model. Training these large networks can require increasing amounts of memory as thousands, hundreds of thousands, millions, or more samples of images, videos, audio clips, texts, papers, natural language sentences, and so on must be presented to the neural network. The results generated by the neural network are then back-propagated through the network to determine adjustments for each of the numerous weights and biases comprising the network. Gradients, intermediate values for weights and biases, and so on must also be stored, further pressuring memory bandwidth. Dividing the processing requirements for training and/or inferencing by the neural network can be straightforward. For example, a matrix multiply function can be divided into multiple smaller submatrix multiply functions, and then assembled to produce the product of the matrix multiply function in a future step. However, handling the bandwidth requirements among processing cores can adversely affect network training time and inference performance. The processing cores can include processing cores within a wafer that enables wafer-scale integration. Enhancing memory bandwidth is supported by back side power delivery for wafer-scale integration with an isometric grid compression plate.

Multiple approaches have been used to increase memory bandwidth including using Static DRAM (SDRAM), Double data rate DRAM (DDR), and so on. The example 1200 shows an AI accelerator card 0 1210. The accelerator includes an AI accelerator 1212. The AI accelerator can include processing cores, custom cores, matrix multiply units, multiply accumulators (MACs), and so on. The AI accelerator can be designed specifically to increase the speed of matrix multiplication and other functions associated with the neural network. The AI accelerator card can include DDR memory 1214. The DDR memory can be DDR1, DDR2, DDR3, DDR4, DDR5, and so on. While each generation of DDR memory has improved bandwidth, the memory chips communicate with the AI accelerator only via the AI accelerator card. The DDR memory can comprise any type of memory. While the memory can be physically close to the accelerator, signals must still travel off a silicon die, through a package, across the board, and through another package to the destination die. This can require long cycle times in comparison to the speed of the memory chips and/or AI processors. In addition, the width of the memory buses to the AI accelerator chips and from the AI accelerator chips can be limited due to the need to interface between multiple physical packages.

An improvement in bandwidth can be achieved by 2.5D technology. The illustration 1200 shows an example of 2.5D technology in AI accelerator card 1 1220. In this case, high bandwidth memory (HBM) 1222 can be included on the same silicon interposer 1224 as the AI accelerator 1226. As shown in 1230, two DRAM dies 1240 can be stacked within the HBM memory. In practice, any number of DRAM dies can be stacked. The DRAM chips can communicate with each other and with a memory controller 1250 via through-silicon vias (TSVs) 1242. Although example 1200 shows DRAM chips, in practice, any type of memory chip can be coupled with 2.5D technology, including LPDDR, GDDR, SRAM, VRAM chips, and so on. The controller and the AI accelerator 1260 can be coupled to the same silicon interposer 1270. The coupling can include micro-bumps, controlled collapse chip connections (C4s), and so on. Communications between the memory controller and the AI accelerator can therefore be accomplished within metal layers of the silicon interposer, improving latency, signal integrity, and/or bandwidth as many more wires can be established within the silicon wafer than would have been possible with a typical packaging interface as shown in 1210. Thus, an extremely high bandwidth bus between the memory and AI accelerator can be established. The silicon interposer can be coupled to a substrate 1280 which can be soldered to AI accelerator card 1. This memory implementation can improve a local bandwidth path between memory to a single AI accelerator (which can include many processors). However, for larger neural networks, bandwidth improvements are also required at the system level between multiple AI accelerators.

Figure 13:
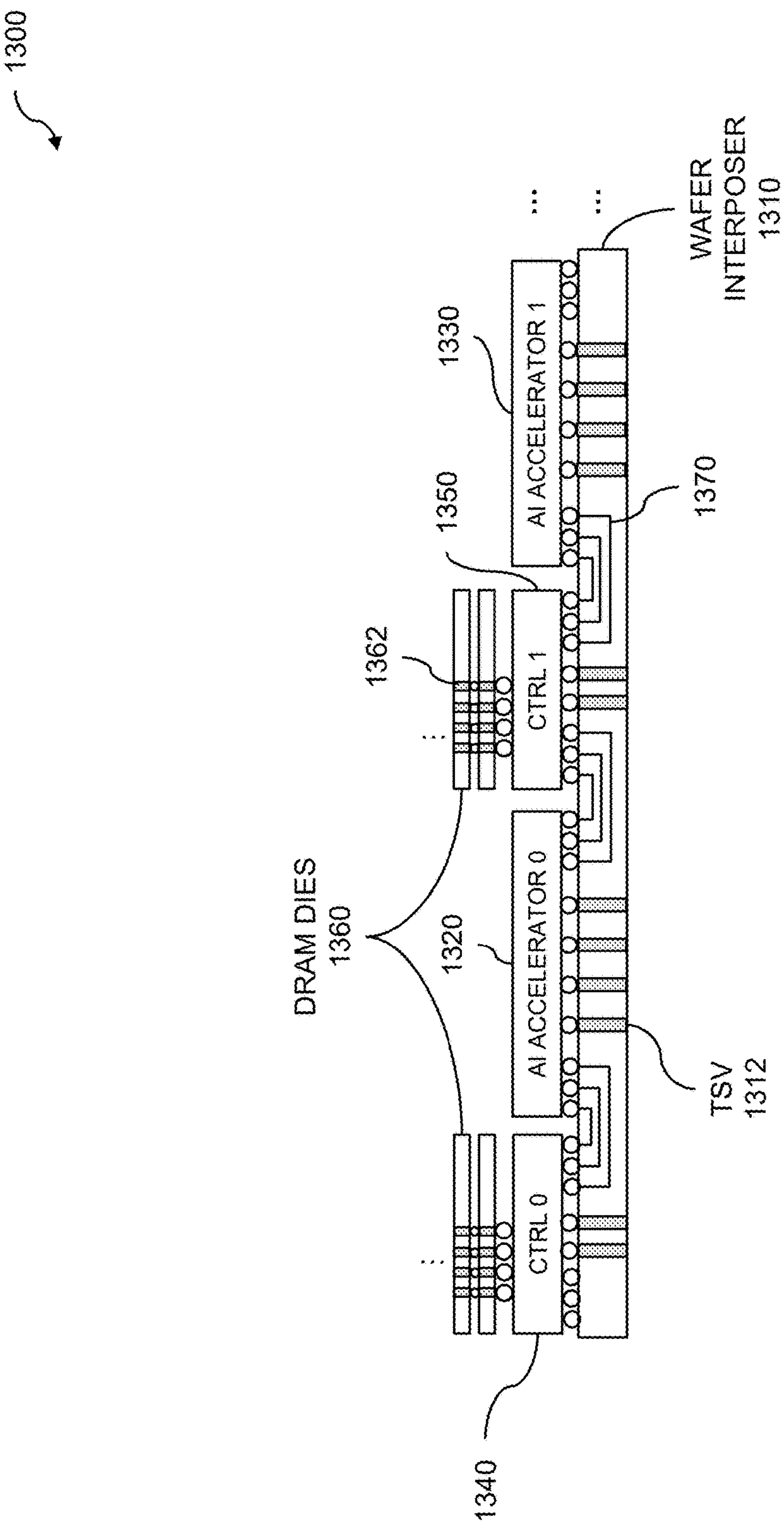
FIG. 13 is a cross-section of wafer scale integration for neural network memory bandwidth.

FIG. 13 is a cross-section of wafer scale integration for neural network memory bandwidth. As described above, a lack of robust and sufficient memory bandwidth, especially for large neural networks, can be performance limiting for the neural network. While memory technology such as 2.5D can improve local memory bandwidth, system-wide memory bandwidth is still a significant technical challenge. Wafer-scale integration can significantly improve these bandwidth requirements by reducing physical separation (e.g., shorter interconnect lengths and thereby delay) between the memory and the processors that are accessing it. The wafer-scale integration includes back side power delivery for wafer-scale integration with an isometric grid compression plate. The memory, processors, and other elements can be provided power by modular power substrates (MPSs) that are attached to a back side of a wafer-scale integration interposer (WSII). The attaching is accomplished using a plurality of elastomer sheets which can adhere the MPSs to the WSII and can provide conducting paths between the MPSs and the WSII. The attaching includes compressing by an isometric grid array (IGA). The MPSs are further connected mechanically to a unified control board (UCB) using high-power sockets. The IGA is stiffened based on a plurality of reinforcement structures. The stiffening enables planar compression of the elastomer sheet. Further, the IGA maintains a coplanarity of the WSII.

The cross-section 1300 shows a wafer interposer 1310. In a usage example, multiple chips such as AI accelerator chips, ML accelerator chips, processors, etc. can be bonded to the wafer interposer. The wafer interposer can include an inorganic wafer such as a silicon wafer or a glass wafer; an organic wafer comprising an organic material such as that used for printed circuit boards; etc. The wafer interposer can comprise a 300 mm wafer, a 200 mm wafer, and so on. The wafer interposer can include any number of through-silicon vias (TSVs) 1312. The TSVs can enable communications between a front side and a back side of the wafer. For example, power can be delivered to the interposer through the back side of the wafer based on the TSVs. To reliably process the TSVs, the back side of the wafer can be ground, polished, and so on to reduce the thickness of the wafer. A plurality of AI accelerators, such as AI accelerator 0 1320 and AI accelerator 1 1330 can be coupled to the wafer interposer. The coupling can include micro-bumps, C4s, and so on. The AI accelerators can be coupled to a plurality of memory controllers, such as memory controller 1340, 1350, and so on. The memory controllers can be based on SDRAM, DDR1, DDR2, DDR3, DDR4, DDR5, HBM, and so on. The memory controllers can be coupled to any number of memory chips. The memory chips can be based on 2.5D technology, which can enable stacking of one or more memory dies such as DRAM dies 1360. The stack of memory dies can enable a hybrid memory cube (HMC). The memory dies can communicate to other memory dies and to the respective controller by TSVs 1362. The memory can be coupled to one or more AI accelerators by wiring paths 1370 within the wafer interposer. Though AI accelerators and memory chips are shown in cross section 1300, in practice any types of chips including processors, system-on-chips (SoCs), application-specific integrations circuits (ASICs), and so on can be incorporated. The wafer interposer can be processed using a back-end-of-line (BEOL) wafer process which can include any number of metal layers. These metal layers can be used to couple any AI accelerator to any memory controller. The wafer metal layers can provide extremely high bandwidth between any memory controller and any AI processor on the wafer.

The wafer scale integration approach shown in FIG. 13 can address the system level bandwidth requirements necessary for computationally intensive processing applications such as large neural networks (NNs). The large neural networks can include convolutional neural networks (CNN). Recall that neural networks with parameter sizes into the billions or trillions can require significant memory for a model executing on the neural network. Recall also that training a large neural network can require a substantial number of training images that can be ten times (or more) the number of parameters. Each of these models must be presented to the network for a forward training pass and back-propagation training pass. Multiple intermediate sets of weights and biases for each node in the neural network can also be stored and maintained though the training process. Further, because the matrix functions for larger neural networks are far too large for any single processor, the processing mentioned above can be divided or partitioned into smaller processing jobs and sent to many processors. The many processors can span many chips, cards, server racks, or even data centers. While adding additional processors can be straightforward (though expensive), keeping those processors running efficiently can be an extremely difficult task, often gated by memory bandwidth. The memory bandwidth can become a gating processing performance factor because relevant data must be sent to every processor, regardless of the location of the processor. Wafer scale integration can reduce bandwidth bottlenecks between many AI accelerators (which can comprise many processor cores, specialized AI cores, specialized ML cores, accelerators, and so on) and significant amounts of memory. As a result, an entire medium to large size neural network can be fully trained and can run inferences on a single wafer interposer. For larger models, such as ChatGPT, any number of wafer interposers can be coupled together to provide a significant improvement in bandwidth and computation speed.

Figure 14:
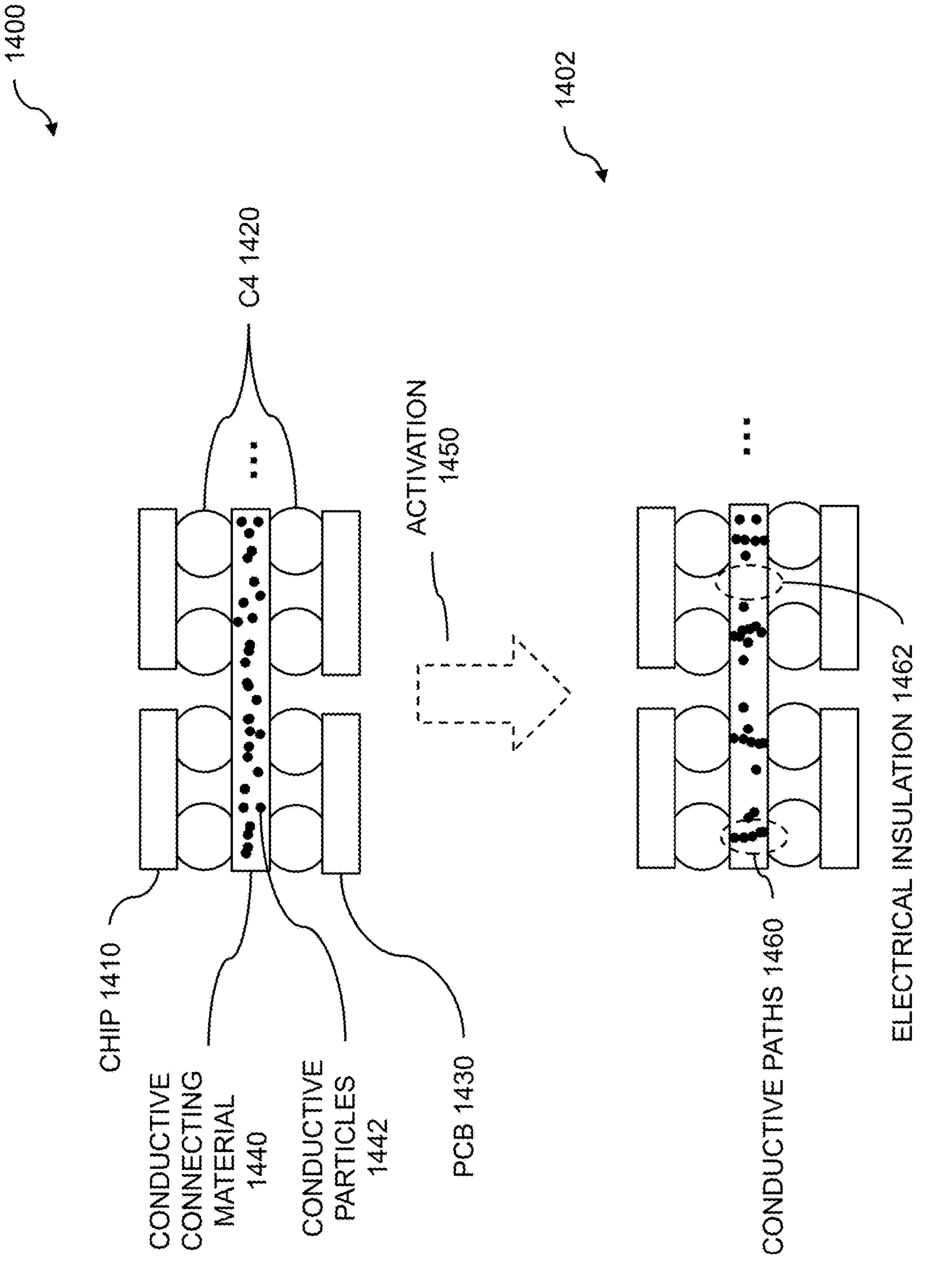
FIG. 14 is an illustration of a conductive connecting material.

FIG. 14 is an illustration of a conductive connecting material. Discussed previously and throughout, a plurality of modular power substrates (MPSs) is attached to a back side of a wafer-scale integration interposer (WSII). The plurality of conductive connecting material attach the plurality of MPSs to the WSII while further providing conduction paths between pads, contacts, terminals, etc. associated with each MPS and corresponding pads, contacts, terminals, etc. associated with the WSII. The attaching can include adhering where the conductive connecting materials includes an adhesive. The conduction paths can be enabled after the MPSs are attached to the WSII, or can be "preprogrammed" prior to the attaching. The attaching based on the plurality of conductive connecting materials enables back side power delivery for wafer-scale integration with an isometric grid compression plate.

The illustration 1400 shows a cross-section that includes functional chips, contacts, a conductive connecting material, and a printed circuit board (PCB). The conductive connecting material is used to couple at least one chip to a printed circuit board (PCB). The PCB can include a wafer-scale integration interposer (WSII). The figure shows a chip, or chiplet, 1410. While one chip is shown, in a usage example, a plurality of chips such as functional chips can be included. The chip can include a processor chip, a multiprocessor chip, an AI accelerator chip, a switching chiplet, a controller chip, and so on. The chip can include a memory. Contact to the chip can be accomplished using micro-bumps, controlled collapse chip connections (C4s), and the like. Examples of C4 connections are shown 1420. The chips can be coupled to a printed circuit board (PCB) 1430. More than one circuit board can be included. The circuit board can include a module. The printed circuit board can include an interposer, a wafer-scale integration interposer (WSII), a unified control board (UCB), and the like. The printed circuit board can include a plurality of contacts. The contacts on the PCB can correspond to contacts associated with one or more chips. The contacts on the PCB can include C4 connections 1420.

A plurality of conductive connecting materials 1440 can be used to couple one or more chips to the PCB. In embodiments, the plurality of conductive connecting materials comprise a plurality of elastomer sheets. The plurality of elastomer sheets can include a variety of materials, configurations, and so on. In some embodiments, a single elastomer sheet can be used. An elastomer sheet can comprise conductive particles 1442, which can be a filament, such as brass, gold, etc., embedded in a sheet of silicone rubber or another suitable material. In the illustration 1400, the conductive particles are shown to be distributed throughout the conductive sheet in a "unprogrammed" state. That is, as shown, the conductive paths have yet to be "activated". However, the conductive elements, or filaments, can be "pre-programmed" to be embedded on a pitch. The pitch can be designed to match a connector array, such as a ball grid array (BGA) of the MPS. Thus, the elastomer sheet may not need any activation 1450 in order to form one or more conductive paths 1460. The elastomer sheet can be held in place with a compression force. An adhesive backing can be added to the elastomer sheet. Thus, the elastomer sheet can accomplish adhesion of the one or more chips to the one or more PCBs. The elastomer sheet can provide conduction paths between the one or more chips and the one or more PCBs.

In embodiments, the plurality of conductive connecting materials comprise a plurality of anisotropic conductive films (ACFs). An ACF can include a film which is both conductive and adhesive. The ACF can be activated using heat, pressure, etc. In embodiments, each ACF in the plurality of ACFs comprises a plurality of conductive particles 1442, wherein the plurality conductive particles forms a plurality of conductive paths in a single plane within each ACF in the plurality of ACFs. As described above, the illustration 1400, shows the conductive particles to be distributed throughout the conductive sheet in a "unprogrammed" state. That is, the conductive paths have yet to be activated. The ACF can be activated 1450 using heat, pressure, one or more electrical fields, etc. The activation can include one or more of the aforementioned techniques. When activated by an amount of heat, the ACF can become slightly tacky. The amount of heat can be low enough to prevent reflow of soldered connections, further diffusion of materials, and so on. The heating of the ACF can cause conductive particles in the ACF to be trapped by prominences such as contacts. When a pressure technique is used, the amount of pressure applied enables the attaching of the MPSs. The conducting paths through the ACF can be enabled by electrical "programming" to determine conducting paths through the ACF after application of the ACF. The ACF can be "pre-programmed" (thus, in that case, no activation 1450 is required to form one or more conductive paths 1460). The conducting paths can be predetermined by setting the conducting paths through the ACF prior to application of the ACF. The ACF is then placed so that conducting paths through the ACF align with contacts on the WSII and the MPSs.

In embodiments, the plurality of conductive connecting materials comprises a plurality of isotropic conductive adhesives (ICAs). A variety of ICAs can be used to accomplish the attaching. The ICA can comprise micro silver flakes. The micro silver flakes can be suspended in an adhesive such as an epoxy, cyanoacrylate, and so on. The micro silver flakes are conductive and enable power transfer, control, and other signals to be provided to and received from the power module. The ICA can comprise an epoxy-based isotropic conductive adhesive. The ICA can comprise polymer spheres. The polymer spheres can conform to irregular surfaces. The polymer spheres can conform to a TSV, a contact, and the like. The polymer spheres can be used to accomplish attaching rather than using an adhesive film. The ICA can be activated 1450 by heat, pressure, etc. Alternatively, the ICA can be pre-programmed such that activation is not necessary to form one or more conductive paths 1460.

The FIG. 1402 shows the conductive sheet after activation. As described above, the conductive connecting materials can be activated 1450 in order to form conducting paths through the conductive sheet. The activating can be accomplished using heat, pressure, and so on. The activation can cause the conductive particles to form a plurality of conductive paths 1460. In some examples, the conductive particles within the conductive connecting material can transfer within the sheet to form the conductive path. The absence of conductive particles within a region of the conductive sheet forms electrical insulation 1462. The conductive connecting material can then be placed so that conducting paths align with contacts on the circuit board such as a WSII, and the chips such as functional chips. Activation may not required when some conductive connecting materials are used, such as an elastomer sheet, or a "pre-programmed" ACF or ICA.

Figure 15:
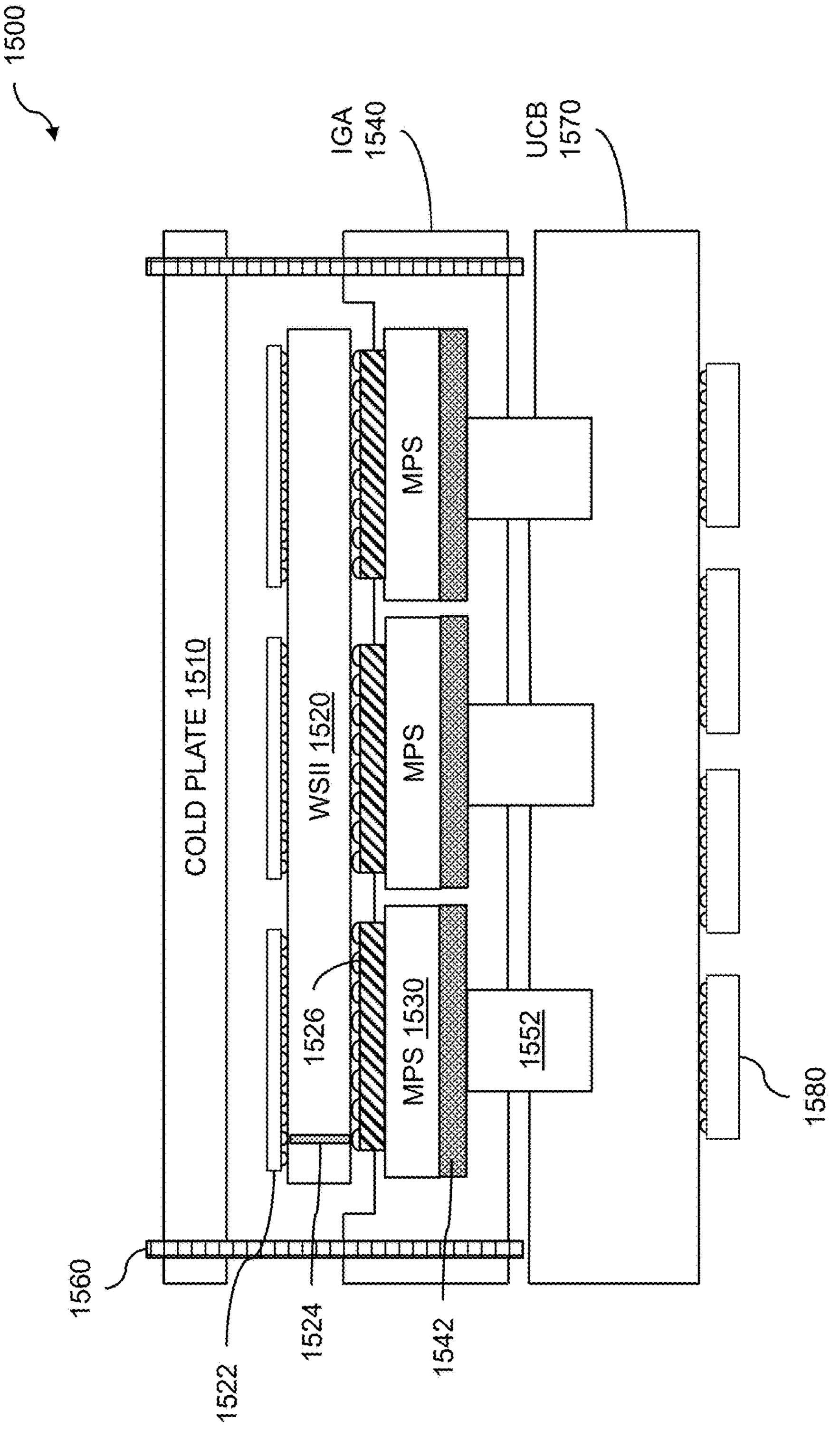
FIG. 15 is a cross-section of an apparatus for back side power delivery for wafer-scale integration with an isometric grid compression plate.

FIG. 15 is a cross-section of an apparatus for back side power delivery for wafer-scale integration with an isometric grid compression plate. Power such as DC power can be sent by a universal control board (UCB) to a plurality of functional chips. The sending can be accomplished using a plurality of DC-to-DC converters, a plurality of modular power substrates (MPSs), and a plurality of through-silicon vias (TSVs). The plurality of functional chips can be bonded to a front side of a wafer-scale integration interposer (WSII). The plurality of MPSs can be attached to a backside of the WSII based on a plurality of conductive connecting materials. The conductive connecting materials can provide adhesion between the MPSs and the WSII. The conductive connecting materials can further provide configurable or preconfigured conduction paths between the MPSs and the WSII. The MPSs can be mechanically connected to the UCB based on a plurality of high power sockets. The UCB can further include a plurality of DC-to-DC power converters. The attaching further includes compressing by an isometric grid array (IGA). The IGA compresses each conductive connecting material within the plurality of conductive connecting materials. The IGA can include a compression plate. The IGA can be stiffened based on a plurality of reinforcements. The stiffening can accomplish one or more goals associated with the apparatus. The stiffening can enable planar compression of the elastomer sheet. In embodiments, the planar compression is based on the one or more spring-loaded fasteners. The planar compression can be based on one or more clamps. The planar compression can enable consistent adhesion of the MPSs to a back side of the WSII. The planar compression can further enable reliable coupling of conduction paths through the conductive connecting material to contacts, pads, etc. associated with the MPSs and the WSII.

The through-silicon vias (TSVs) can be used to provide connections between a front side of the WSII and a back side of the WSII. The WSII can be used to achieve wafer-scale integration (WSI). The WSII can be used to mount various elements such as electrical elements and to provide interconnections among the mounted elements. The interposer can include other inorganic materials such as glass. An apparatus for power delivery is disclosed comprising: a wafer-scale integration interposer (WSII), wherein a front side of the WSII is bonded to a plurality of functional chips, wherein the WSII includes a plurality of through-silicon vias (TSVs); a plurality of modular power substrates (MPSs), wherein the plurality of MPSs is attached to a back side of the WSII by a plurality of conductive connecting materials; an isometric grid array (IGA), wherein the IGA includes a plurality of reinforcement structures, wherein each reinforcement structure in the plurality of reinforcement structures enables planar compression of each conductive connecting material within the plurality of conductive connecting materials; a cold plate, wherein the cold plate is attached to one or more functional chips, and wherein the cold plate is mounted to the IGA; and a unified circuit board (UCB), wherein the UCB is mechanically connected to the plurality of MPSs, wherein the UCB includes a plurality of DC-to-DC converters, wherein the UCB sends DC power to the plurality of functional chips bonded to the WSII.

The apparatus 1500 includes a cold plate 1510, wherein the cold plate is attached to one or more functional chips, and wherein the cold plate is mounted to an isometric grid array (IGA) (described below). The cold plate can be used to extract a portion of heat generated by functional chips as the functional chips operate. Recall that prodigious amounts of heat can be generated by chips and other electronic elements as they are operating. This point can be particularly relevant to high-performance chips. The mounting of the cold plate to a grid such as an IGA can be accomplished using clips, screws, bolts, clamps, and so on.

The apparatus 1500 includes a wafer-scale integration interposer (WSII) 1520, wherein a front side of the WSII is bonded to a plurality of functional chips, wherein the WSII includes a plurality of through-silicon vias (TSVs). The WSII can include inorganic materials or organic materials. In a usage example, the interposer can include a silicon interposer or a glass interposer. Micro-bumps discussed above can be used to mount the one or more functional chips to the front side of the WSII. Communications between the functional chips can be accomplished within metal layers of the interposer, thereby reducing latency and parasitics such as resistance, capacitance, and inductance, enabling improvement of signal integrity and/or bandwidth, etc. The reductions and improvements result from the opportunity for many more wires being established within the WSII compared to what would have been possible with a typical packaging interface. Thus, the WSII can enable extremely high bandwidth buses and control signals between chips mounted to the WSII. The WSII can include one or more optical waveguides. The optical waveguides can enable chip-to-chip communications via one or more wavelengths of light. The optical waveguides can comprise the buses and control signals between chips. The wafer interposer can also be used to attach additional boards, modules, components and so on. The further attachments can be located on the opposite side of the of the wafer interposer from the mounted functional chips.

The apparatus 1500 includes a plurality of functional chips, such as functional chip 1522. The functional chips can include a processor chip, a multi-core processor chip, a graphics processor chip, a system-on-a-chip, a memory chip, an application-specific integrated circuit (ASIC), an artificial intelligence (AI) or machine learning (ML) accelerator, a vertical-cavity surface-emitting laser (VCSEL), and so on. The functional chips can include an integrated circuit designed for a flip-chip application. A chip design for a flip-chip application can include a chip for which connections to the chip are accomplished at the top layer of the chip. The connections can include positive and negative DC power connections, data connections, control connections, and so on. The various chip connections can include pads on the top layer of the chips. The functional chips can include a chip that can accomplish a processing function such as a deep learning function.

Various techniques can be used to make connections to the top of a functional chip. In a usage example, a technique based on micro-bumps can be used. A micro-bump can be associated with each connection point or pad on each chip. The micro-bumps can comprise a dense array of connection points or pads. The micro-bumps can include a material appropriate for mounting the chip to a substrate, a board, an interposer, and so on. The micro-bumps can include solder micro-bumps. These micro-bumps can be arranged in a ball grid array (BGA) or some other geometry. The WSII includes a plurality of through-silicon vias (TSVs) such as show at 1524. The TSVs can provide a connection between the micro-bumps on the top side of the WSII and the connectors on the bottom side of the WSII. The TSV connections can be used to deliver power to the functional chips through the back side of the WSII.

The apparatus 1500 includes a plurality of modular power substrates (MPSs) 1530, wherein the plurality of MPSs is attached to a back side of the WSII by a plurality of conductive connecting materials. The apparatus can include a number of different conductive connecting materials. In embodiments, the plurality of conductive connecting materials comprises a plurality of elastomer sheets. In embodiments, the plurality of conductive connecting materials comprises a plurality of anisotropic conductive films (ACFs). In embodiments, the plurality of conductive connecting materials comprises a plurality of isotropic conductive adhesives (ICAs). An MPS can be coupled to one or more elements associated with the WSII. In embodiments, each MPS in the plurality of MPSs is coupled to one or more functional chips within the plurality of functional chips. In embodiments, each MPS within the plurality of MPSs is based on a form factor mirroring one or more corresponding functional chips within the plurality of functional chips on the front side of the WSII. The form factor of the MPS can be associated with or dependent on components mounted to the wafer interposer. In a usage example, the plurality of MPSs can be based on a form factor mirroring the corresponding functional chip. The form factor of the MPS can have a 1:1 relationship to the one or more corresponding functional chips or can include other shape factors. The MPSs can be based on a variety of materials. In a usage example, one or more MPSs within the plurality of MPSs comprise an inorganic substrate. An inorganic substrate can include a silicon substrate, a glass substrate, and so on. In another usage example, one or more MPSs within the plurality of MPSs comprise an organic substrate. The organic substrates can include substrates such as printed circuit boards. Recall that the functional chips are mounted to the front or top side of the WSII. In embodiments, the plurality of MPSs is attached to a back side of the WSII. Connections between the wafer interposer and the MPS can be accomplished using the conductive connecting materials 1526. The plurality of conductive connecting materials attaches, which can include adhering, the MPSs to the WSII. The plurality of conductive connecting materials further provide conduction paths between pads or contacts associated with the MPSs and corresponding pads or contacts associated with the WSII.

An MPS 1530 can include a plurality of step-down power modules and/or DC-to-DC converters. The DC-to-DC converters on an MPS can be placed across the MPS. The DC-to-DC converters on the MPSs can accomplish altering of a DC voltage. The altering the DC voltage can result in a second DC voltage. In a usage example, the power can be altered, wherein altering, by the plurality of MPSs, is accomplished by the DC power that was sent, and wherein the altering is based on a second voltage conversion. The second voltage conversion can include a second DC-to-DC voltage conversion. In embodiments, the second voltage conversion results in a voltage less than a threshold. The threshold can include a voltage appropriate to a voltage required by a functional chip. In embodiments, the threshold can include 1 volt.

The apparatus 1500 includes an isometric grid array (IGA) 1540, wherein the IGA includes a plurality of reinforcement structures 1542, wherein each reinforcement structure in the plurality of reinforcement structures enables planar compression of each conductive connecting material within the plurality of conductive connecting materials. Each reinforcement structure 1542 in the plurality of reinforcement structures can stiffen each MPS in the plurality of MPSs, respectively. In embodiments, the planar compression is based on the one or more spring-loaded fasteners. The planar compression can be based on one or more clamps. The clamps can provide more compression force than the spring-loaded fasteners. Both spring-loaded fasteners and clamps can be used. The MPS can be stiffened for a variety of purposes. Recall that MPSs are attached to the back side of the WSII based on a plurality of conductive connecting materials. When the conductive connecting materials comprises certain materials, such as elastomer sheets, a force sufficient can be applied substantially equally across the plurality of MPSs to form a reliable electrical coupling between the MPSs and the WSII. When an adhesive material is used, The IGA can be used to apply sufficient force to enable adhesion. In embodiments, the IGA comprises a compression plate. In other embodiments, the IGA maintains a coplanarity of the WSII. Recall that a cold plate is mounted to the IGA. In embodiments, the mounting is based on one or more spring-loaded fasteners 1560. Any other fasteners, such as a screw, clamp, and so on can be used. The spring-loaded fasteners can squeeze the WSSI between the cold plate and the IGA. The pressure on the WSSI can be exerted by the IGA through the MPSs after they have been inserted into the reinforcement structure. This can enable planar compression on the WSSI. In embodiments, the planar compression is based on the one or more spring-loaded fasteners.

The coplanarity of each MPS can enable adhesion and/or connection by the conductive connecting materials without causing the WSII to deflect, crack, fracture, and so on. Each reinforcement structure can be formed using a variety of techniques. Usage examples can include depositing, on each MPS within the plurality of MPSs, the reinforcement structure. The reinforcement structure can be deposited using a fabrication technique such as chemical vapor deposition (CVD). Other embodiments include gluing, to each MPS within the plurality of MPSs, the reinforcement structure. The gluing can be accomplished using adhesives such as an epoxy, cyanoacrylate, and so on.

The apparatus 1500 includes a unified circuit board (UCB) 1570, wherein the UCB is mechanically connected to the plurality of MPSs, wherein the UCB includes a plurality of DC-to-DC converters, wherein the UCB sends DC power to the plurality of functional chips bonded to the WSII. The sending can be based on the plurality of MPSs and the plurality of TSVs. The MPS discussed previously can be mechanically connected to a unified control board (UCB). An MPS can include a connector, where the connector can be used to mechanically connect the MPS to the UCB. For the apparatus 1500, the connector can comprise a socket 1552 on the UCB. The socket can comprise a high-power socket, a high voltage socket, and so on. The mechanical connection can include one or more plugs, pins, terminals, contacts, etc. from the UCB which can be inserted into the socket. In a usage example, the mechanical connection can be based on a high voltage socket, wherein the high voltage socket transfers power from the UCB to the plurality of MPSs. The high voltage socket can be used to provide a first DC voltage that can be converted to a second DC voltage by one or more DC-to-DC converters. The mechanical connection can accommodate a maximum lateral displacement of the UCB due to thermal expansion during operation. In a usage example, the mechanical connection can include a compliant connector. The lateral displacement can result from thermal expansion of the WSII, the UCB, and/or the MPS during operation.

The UCB includes a plurality of DC-to-DC power converters 1580. As described above, each DC-to-DC power converter in the plurality of DC-to-DC power converters can include a mechanical connection to a respective MPS in the plurality of MPSs. The mechanical connection between each DC-to-DC converter and a respective MPS can enable power transfer, control, and so on. The mechanical connections between the plurality of DC-to-DC converters and the plurality of MPSs can remain reliable when the DC-to-DC converters and the MPSs are operating. The mechanical connection can accommodate a maximum lateral displacement of the UCB due to thermal expansion during operation. The handling a maximum lateral displacement is critical to maintaining reliable mechanical connections between and among components, the WSII, one or more UCBs, one or more MPSs, and so on.

The UCB 1570 can include a digital controller chip (not shown). The DC-to-DC converters can be controlled by a control chip associated with the UCB. The digital controller chip can control power delivery to the plurality of functional chips. The controlling power delivery can include enabling or disabling power transfer, controlling an input voltage to and an output voltage from a DC-to-DC converter, and the like. A usage example can include matching each DC-to-DC power converter within the plurality of DC-to-DC power converters included on the UCB to one or more respective MPSs in the plurality of MPSs. DC power from a DC-to-DC converter can be sent to an MPS via an interconnect on the UCB. DC power can be fed to the DC-to-DC converters. Recall that an MPS can include a connector that can accommodate lateral displacement of the UCB due to thermal expansion during operation. The connector can accomplish other functions. In a usage example, the connector can include one or more power control signals from the digital controller chip to the plurality of MPSs. The control signals can enable and disable elements such as controller chips and DC-to-DC converters, can provide instructions to controller chips, etc. In a further usage example, the connector can carry at least a portion of DC power from the plurality of MPSs to the plurality of functional chips. As explained above and throughout, the WSII and the UCB can expand at different rates due to different CTEs. Thus, the MPSs that are attached to the UCB can also move, which can cause connections associated with the elastomer sheets between the WSII and the MPSs become unreliable. To mitigate this movement due to expansion, as explained previously, the MPS can be designed modularly, effectively isolating movement between MPSs. In addition, the socket, which can be a high-power socket, a high voltage socket, etc., can comprise a compliant connector.

Figure 16:
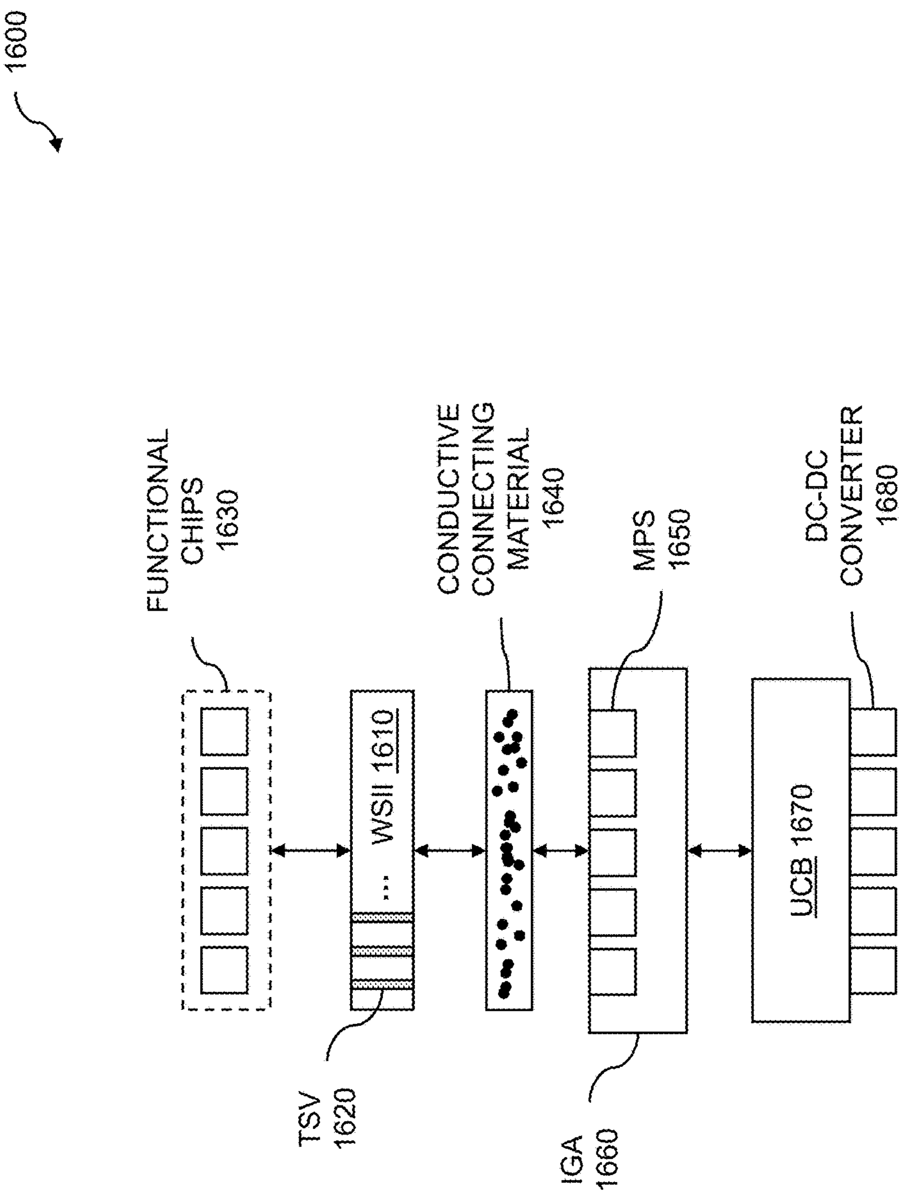
FIG. 16 is a system diagram for back side power delivery for wafer-scale integration with an isometric grid compression plate.

FIG. 16 is a system diagram for back side power delivery for wafer-scale integration with an isometric grid compression plate. The IGA includes a plurality of reinforcement structures. Each reinforcement structure in the plurality of reinforcement structures enables planar compression of each elastomer sheet within a plurality of elastomer sheets. The IGA can accomplish stiffening of a wafer-scale integration interposer (WSII). Power can be provided to the WSII by a unified control board. Recall that the WSII can be bonded to a plurality of functional chips. The functional chips can include processors, multiprocessors, machine learning (ML) processors, graphics processors, memories, switches, and so on. The functional chips can be bonded to a front side of the WSII. The functional chips can be in communication with elements such as modular power substrates (MPSs) that can be attached to a back side of the WSII. The communication between the functional chips and the MPSs can be accomplished using through-silicon vias (TSVs). To enable the fabrication of the TSVs and to improve the reliability of the TSVs, the WSII can be ground, polished, and so on to reduce the thickness of the WSII. The resulting thin WSII can be delicate and therefore susceptible to fracturing. Attaching of the MPSs can be based on a plurality of conductive connecting materials. The attaching includes compressing, by an isometric grid array (IGA), each conductive connecting material within the plurality of conductive connecting materials.

The attaching couples each MPS within the plurality of MPSs to one or more functional chips within the plurality of functional chips.

Disclosed is a system for power delivery comprising: a wafer-scale integration interposer (WSII), wherein a front side of the WSII is bonded to a plurality of functional chips, wherein the WSII includes a plurality of through-silicon vias (TSVs); a plurality of modular power substrates (MPSs), wherein the plurality of MPSs is attached to a back side of the WSII by a plurality of conductive connecting materials; an isometric grid array (IGA), wherein the IGA includes a plurality of reinforcement structures, wherein each reinforcement structure in the plurality of reinforcement structures enables planar compression of each conductive connecting material within the plurality of conductive connecting materials; a cold plate, wherein the cold plate is attached to one or more functional chips, and wherein the cold plate is mounted to the IGA; and a unified circuit board (UCB), wherein the UCB is mechanically connected to the plurality of MPSs, wherein the UCB includes a plurality of DC-to-DC converters, and wherein the system, when provided DC power, is configured to: send DC power to the plurality of functional chips bonded to the WSII, wherein the sending is based on the plurality of DC-to-DC converters, the plurality of MPSs, and the plurality of TSVs.

The system 1600 includes a wafer-scale integration interposer (WSII) 1610, wherein a front side of the WSII is bonded to a plurality of functional chips, wherein the WSII includes a plurality of through-silicon vias (TSVs) 1620. The WSII can comprise an inorganic wafer such as a silicon wafer, a glass wafer, and so on. The WSII can include an organic wafer. The plurality of functional chips 1630 can include general purpose chips such as processor chips, multiprocessor chips, graphics processor chips, memory chips, switching chips such as switching chiplets, application-specific integrated circuits (ASICS), systems-on-chip (SoCs), memory chips, artificial intelligence (AI) and machine learning (ML) accelerators, and so on. The plurality of functional chips can include optical chips such as VCSELs. The plurality of functional chips can create prodigious heat during operation. The heat can be due to current provided to the functional chips such as active current, overcurrent, leakage current, and so on. The heat can result from IR drops associated with interconnect, active devices, leakage current, etc. within the functional chips. The functional chips can be bonded to the WSII via micro-bumps, controlled collapse chip connections (C4s), and so on. The WSII includes a plurality of through-silicon vias (TSVs). A TSV can include an electrical connection that completely passes through a wafer such as a silicon wafer or a die. The plurality of TSVs is oriented vertically in order to enable connections between the front side of the wafer and the back side of the wafer.

The system 1600 includes a plurality of conductive connecting materials 1640. The plurality of conductive connecting materials enable attaching a plurality of modular power substrates (MPSs). In embodiments, the plurality of conductive connecting materials comprise a plurality of elastomer sheets. The plurality of elastomer sheets can include a variety of materials, configurations, and so on. In some embodiments, a single elastomer sheet can be used. An elastomer sheet can comprise conductive particles, which can be a filament, such as brass, gold, etc., embedded in a sheet of silicone rubber or another suitable material. In the system 1600, the conductive particles are shown to be distributed throughout the conductive sheet in a “unprogrammed” state. That is, as shown, the conductive paths have yet to be “activated”. However, the conductive elements, or filaments, can be “pre-programmed” to be embedded on a pitch. The pitch can be designed to match a connector array, such as a ball grid array (BGA) of the MPS. Thus, the elastomer sheet may not need any activation in order to form one or more conductive paths. The elastomer sheet can be held in place with a compression force. An adhesive backing can be added to the elastomer sheet. Thus, the elastomer sheet can accomplish adhesion of the one or more chips to the one or more PCBs. The elastomer sheet can provide conduction paths between the one or more chips and the one or more PCBs.

In embodiments, the plurality of conductive connecting materials 1640 comprise a plurality of anisotropic conductive films (ACFs). An ACF can include a film which is both conductive and adhesive. The ACF can be activated using heat, pressure, etc. In embodiments, each ACF in the plurality of ACFs comprises a plurality of conductive particles, wherein the plurality conductive particles forms a plurality of conductive paths in a single plane within each ACF in the plurality of ACFs. As described above, the system 1600, shows the conductive particles to be distributed throughout the conductive sheet in a “unprogrammed” state. That is, the conductive paths have yet to be activated. The ACF can be activated using heat, pressure, one or more electrical fields, etc. The activation can include one or more of the aforementioned techniques. When activated by an amount of heat, the ACF can become slightly tacky. The amount of heat can be low enough to prevent reflow of soldered connections, further diffusion of materials, and so on. The heating of the ACF can cause conductive particles in the ACF to be trapped by prominences such as contacts. When a pressure technique is used, the amount of pressure applied enables the attaching of the MPSs. The conducting paths through the ACF can be enabled by electrical “programming” to determine conducting paths through the ACF after application of the ACF. The ACF can be “pre-programmed” (thus, in that case, no activation is required to form one or more conductive paths). The conducting paths can be predetermined by setting the conducting paths through the ACF prior to application of the ACF. The ACF is then placed so that conducting paths through the ACF align with contacts on the WSII and the MPSs.

In embodiments, the plurality of conductive connecting materials 1640 comprises a plurality of isotropic conductive adhesives (ICAs). A variety of ICAs can be used to accomplish the attaching. The ICA can comprise micro silver flakes. The micro silver flakes can be suspended in an adhesive such as an epoxy, cyanoacrylate, and so on. The micro silver flakes are conductive and enable power transfer, control, and other signals to be provided to and received from the power module. The ICA can comprise an epoxy-based isotropic conductive adhesive. The ICA can comprise polymer spheres. The polymer spheres can conform to irregular surfaces. The polymer spheres can conform to a TSV, a contact, and the like. The polymer spheres can be used to accomplish attaching rather than using an adhesive film. The ICA can be activated by heat, pressure, etc. Alternatively, the ICA can be pre-programmed such that activation is not necessary to form one or more conductive paths.

The system 1600 includes a plurality of modular power substrates (MPSs) 1650, wherein the plurality of MPSs is attached to a back side of the WSII by a plurality of conductive connecting materials 1640. Described previously and throughout, the MPSs can include one or more DC-to-DC converters, a high voltage socket, a high voltage connector, and so on. In embodiments, each MPS within the plurality of MPSs is based on a form factor mirroring one or more corresponding functional chips within the plurality of functional chips on the front side of the WSII. The system 1600 includes an isometric grid array (IGA) 1660, wherein the IGA includes a plurality of reinforcement structures, wherein each reinforcement structure in the plurality of reinforcement structures enables planar compression of each elastomer sheet within the plurality of elastomer sheets. The IGA and each reinforcement structure within the plurality of reinforcement structures accomplishes stiffening of each MPS in the plurality of MPSs. In embodiments, the IGA maintains a coplanarity of the WSII. Maintaining coplanarity of the WSII reduces the risk of the WSII fracturing or cracking under pressure applied by the IGA.

The system 1600 includes a unified circuit board (UCB) 1670, wherein the UCB is mechanically connected to the plurality of MPSs, wherein the UCB includes a plurality of DC-to-DC converters 1680. The mechanical connection of the UCB to the plurality of MPSs can be accomplished using a variety of connection techniques, where the connection techniques can be accomplished using locking connectors, non-locking connectors, screws, bolts, and so on. The connectors can include rigid connectors, high power connectors, high voltage connectors, and the like. The mechanical connection can be based on a high-power socket (which can be a high voltage socket). The modularity of the MPSs can allow for movement between the UCB and the WSII. Movement, such as a linear displacement, can occur due to differences in coefficients of thermal expansion (CTE). The USB can include one or more control circuits. The control circuits can be used to generate control signals to one or more functional chips, enable transfers of data, control DC-to-DC converters, and the like. The UCB includes a plurality of DC-to-DC power converters 1680. The DC-to-DC converters can convert DC power from a high DC voltage range, such as 48 volts to 54 volts, to a lower DC voltage range, such as 12 volts to 13.5 volts. The DC-to-DC converters can be mounted on the unified control board (UCB) 1670. The UCB can provide controls such as control signals, and power such as DC power, to the DC-to-DC converters. The UCB can comprise a single control board. The single control board can include an organic control board or an inorganic control board. The UCB can comprise multiple control boards and/or circuits. The UCB can include a printed circuit board (PCB). The PCB can include a ceramic board, a glass board, and the like. In some embodiments, the PCB comprises aluminum nitride. Aluminum nitride can have a similar CTE to silicon, reducing the lateral displacement between the WSII and the UCB during operation. The system 1600, when provided power, is configured to: send DC power to the plurality of functional chips bonded to the WSII, wherein the sending is based on the plurality of DC-to-DC converters, the plurality of MPSs, and the plurality of TSVs. The sending can include the first voltage conversion, and the second voltage conversion as described above.

Each of the above methods may be executed on one or more processors on one or more computer systems. Embodiments may include various forms of distributed computing, client/server computing, and cloud-based computing. Further, it will be understood that the depicted steps or boxes contained in this disclosure’s flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagram and flow diagram illustrations depict methods, apparatus, systems, and computer program products. The elements and combinations of elements in the block diagrams and flow diagrams show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general-purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM); an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States, then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A method for power delivery comprising:

accessing a wafer-scale integration interposer (WSII), wherein a front side of the WSII is bonded to a plurality of functional chips, wherein the WSII includes a plurality of through-silicon vias (TSVs);

attaching, to a back side of the WSII, a plurality of modular power substrates (MPSs), wherein the attaching is accomplished using a plurality of conductive connecting materials, wherein the attaching includes compressing, by an isometric grid array (IGA), each conductive connecting material within the plurality of conductive connecting materials, and wherein the attaching couples each MPS within the plurality of MPSs to one or more functional chips within the plurality of functional chips;

connecting mechanically the plurality of MPSs to a unified control board (UCB), wherein the connecting mechanically is based on a plurality of high power sockets, and wherein the UCB includes a plurality of DC-to-DC power converters; and sending DC power, by the UCB, to the plurality of functional chips, wherein the sending is based on the plurality of DC-to-DC power converters, the plurality of MPSs, and the plurality of TSVs.

2. The method of claim 1 wherein the plurality of conductive connecting materials comprises a plurality of elastomer sheets.

3. The method of claim 1 wherein the plurality of conductive connecting materials comprises a plurality of isotropic conductive adhesives (ICAs).

4. The method of claim 1 wherein the plurality of conductive connecting materials comprises a plurality of anisotropic conductive films (ACFs).

5. The method of claim 4 wherein each ACF in the plurality of ACFs comprises a plurality of conductive particles, wherein the plurality of conductive particles forms a plurality of conductive paths in a single plane within each ACF in the plurality of ACFs.

6. The method of claim 1 wherein the IGA comprises a grid.

7. The method of claim 6 wherein each MPS within the plurality of MPSs is based on a form factor mirroring one or more corresponding functional chips within the plurality of functional chips on the front side of the WSII.

8. The method of claim 7 wherein each open recess within a plurality of open recesses within the IGA matches a form factor of each MPS in the plurality of MPSs.

9. The method of claim 1 further comprising attaching a cold plate to the one or more functional chips.

10. The method of claim 9 wherein the attaching includes a thermal interface material (TIM).

11. The method of claim 9 wherein the compressing includes mounting the cold plate to the IGA.

12. The method of claim 11 wherein the mounting is based on one or more spring-loaded fasteners.

13. The method of claim 12 wherein the compressing is based on the one or more spring-loaded fasteners.

14. The method of claim 13 wherein the IGA comprises a compression plate.

15. The method of claim 14 further comprising stiffening the IGA, wherein the stiffening is based on a plurality of reinforcement structures.

16. The method of claim 15 wherein the stiffening enables planar compression of the conductive connecting material.

17. The method of claim 15 wherein the IGA maintains a coplanarity of the WSII.

18. The method of claim 1 wherein the sending includes delivering the DC power, by the UCB, to the plurality of MPSs, wherein the delivering includes a first voltage conversion.

19. The method of claim 18 further comprising transferring the DC power that was delivered, by the plurality of MPSs, to the plurality of functional chips, wherein the transferring includes a second voltage conversion.

20. An apparatus for power delivery comprising:

a wafer-scale integration interposer (WSII), wherein a front side of the WSII is bonded to a plurality of functional chips, wherein the WSII includes a plurality of through-silicon vias (TSVs);

a plurality of modular power substrates (MPSs), wherein the plurality of MPSs is attached to a back side of the WSII by a plurality of conductive connecting materials;

an isometric grid array (IGA), wherein the IGA includes a plurality of reinforcement structures, wherein each reinforcement structure in the plurality of reinforcement structures enables planar compression of each conductive connecting material within the plurality of conductive connecting materials;

a cold plate, wherein the cold plate is attached to one or more functional chips, and wherein the cold plate is mounted to the IGA; and a unified circuit board (UCB), wherein the UCB is mechanically connected to the plurality of MPSs, wherein the UCB includes a plurality of DC-to-DC converters, wherein the UCB sends DC power to the plurality of functional chips bonded to the WSII.

21. The apparatus of claim 20 wherein the plurality of conductive connecting materials comprises a plurality of elastomer sheets.

22. The apparatus of claim 20 wherein the IGA comprises a compression plate.

23. The apparatus of claim 22 wherein the mounting is based on one or more spring-loaded fasteners.

24. The apparatus of claim 23 wherein the planar compression is based on the one or more spring-loaded fasteners.

25. The apparatus of claim 20 wherein each MPS within the plurality of MPSs is based on a form factor mirroring one or more corresponding functional chips within the plurality of functional chips on the front side of the WSII.

26. A system for power delivery comprising:

a wafer-scale integration interposer (WSII), wherein a front side of the WSII is bonded to a plurality of functional chips, wherein the WSII includes a plurality of through-silicon vias (TSVs);

a plurality of modular power substrates (MPSs), wherein the plurality of MPSs is attached to a back side of the WSII by a plurality of conductive connecting materials;

an isometric grid array (IGA), wherein the IGA includes a plurality of reinforcement structures, wherein each reinforcement structure in the plurality of reinforcement structures enables planar compression of each conductive connecting material within the plurality of conductive connecting materials;

a cold plate, wherein the cold plate is attached to one or more functional chips, and wherein the cold plate is mounted to the IGA; and a unified circuit board (UCB), wherein the UCB is mechanically connected to the plurality of MPSs, wherein the UCB includes a plurality of DC-to-DC converters, and wherein the system, when provided DC power, is configured to:

send DC power to the plurality of functional chips bonded to the WSII, wherein the sending is based on the plurality of DC-to-DC converters, the plurality of MPSs, and the plurality of TSVs.

27. The system of claim 26 wherein the plurality of conductive connecting materials comprises a plurality of elastomer sheets.

* * * * *